(12) United States Patent
Hashimoto

(10) Patent No.: US 9,774,168 B2
(45) Date of Patent: Sep. 26, 2017

(54) QUANTUM CASCADE SEMICONDUCTOR LASER

(71) Applicant: SUMITOMO ELECTRIC INDUSTRIES, LTD., Osaka (JP)

(72) Inventor: Jun-ichi Hashimoto, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/088,490

(22) Filed: Apr. 1, 2016

(65) Prior Publication Data

US 2016/0294159 A1    Oct. 6, 2016

(30) Foreign Application Priority Data

Apr. 3, 2015   (JP) .................................. 2015-076967

(51) Int. Cl.
*H01S 5/00* (2006.01)
*H01S 3/08* (2006.01)
(Continued)

(52) U.S. Cl.
CPC .......... *H01S 5/3402* (2013.01); *H01S 3/0675* (2013.01); *H01S 5/0224* (2013.01);
(Continued)

(58) Field of Classification Search
CPC ...... H01S 5/3402; H01S 5/227; H01S 3/0675; H01S 5/3401; H01S 5/0224; H01S 5/125;
(Continued)

(56) References Cited

U.S. PATENT DOCUMENTS

2003/0231686 A1* 12/2003 Liu ................. B82Y 20/00
                                                372/50.11
2010/0164636 A1*  7/2010 Sekiguchi ......... B82Y 20/00
                                                331/107 T
(Continued)

FOREIGN PATENT DOCUMENTS

JP       2003-526214       9/2003

OTHER PUBLICATIONS

S. Golka et al., "GaAs/AlGaAs Quantum Cascade Lasers With Dry Etched Semiconductor-Air Bragg Reflectors", Journal of Modern Optics, vol. 52, No. 16, pp. 2303-2308, 2005.

*Primary Examiner* — Yuanda Zhang
(74) *Attorney, Agent, or Firm* — Smith, Gambrell & Russell, LLP.

(57) ABSTRACT

A quantum cascade semiconductor laser includes a substrate with a main surface including a waveguide area and a distributed Bragg reflection area that are arranged in a direction of a first axis; a laser region provided on the waveguide area, the laser region including a mesa waveguide having first and second side surfaces, and first and second burying regions provided on the first and second side surfaces, respectively; a distributed Bragg reflection region provided on the distributed Bragg reflection area, the distributed Bragg reflection region including a semiconductor wall having first bulk semiconductor regions and first laminate regions that are alternately arrayed in a direction of a second axis intersecting the first axis; and an upper electrode provided on the laser region. Each first bulk semiconductor region includes a bulk semiconductor layer. Each first laminate region includes a stacked semiconductor layer having a plurality of semiconductor layers.

15 Claims, 20 Drawing Sheets

(51) Int. Cl.
    *H01S 5/34*           (2006.01)
    *H01S 3/067*         (2006.01)
    *H01S 5/227*         (2006.01)
    *H01S 5/022*         (2006.01)
    *H01S 5/125*         (2006.01)
    *H01S 5/024*         (2006.01)
    *H01S 5/22*           (2006.01)

(52) U.S. Cl.
    CPC .............. *H01S 5/125* (2013.01); *H01S 5/227* (2013.01); *H01S 5/2275* (2013.01); *H01S 5/3401* (2013.01); *H01S 5/02461* (2013.01); *H01S 5/2214* (2013.01); *H01S 5/2224* (2013.01)

(58) Field of Classification Search
    CPC .. H01S 5/2275; H01S 5/02461; H01S 5/2224; H01S 5/2214
    See application file for complete search history.

(56) References Cited

U.S. PATENT DOCUMENTS

2013/0329761 A1* 12/2013 Hashimoto ........... H01S 5/3401
                                                       372/45.012
2015/0357794 A1* 12/2015 Tsuji ..................... H01S 5/3402
                                                       372/45.012

\* cited by examiner

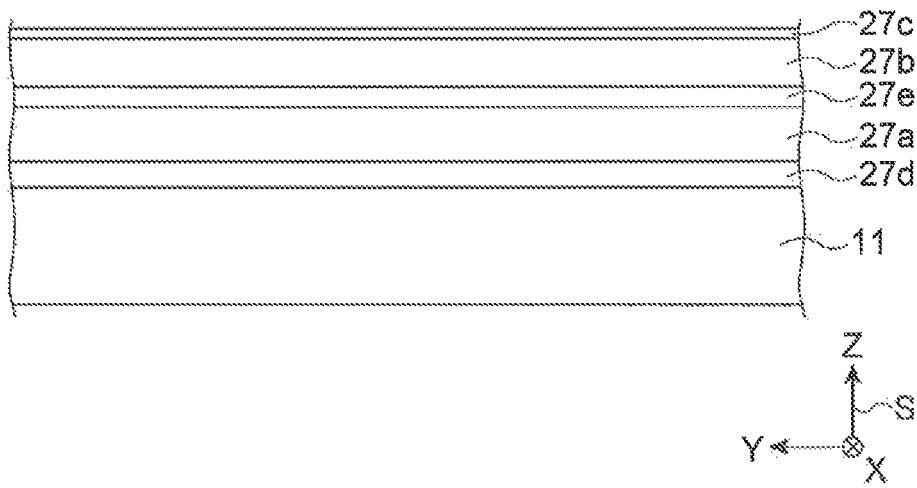
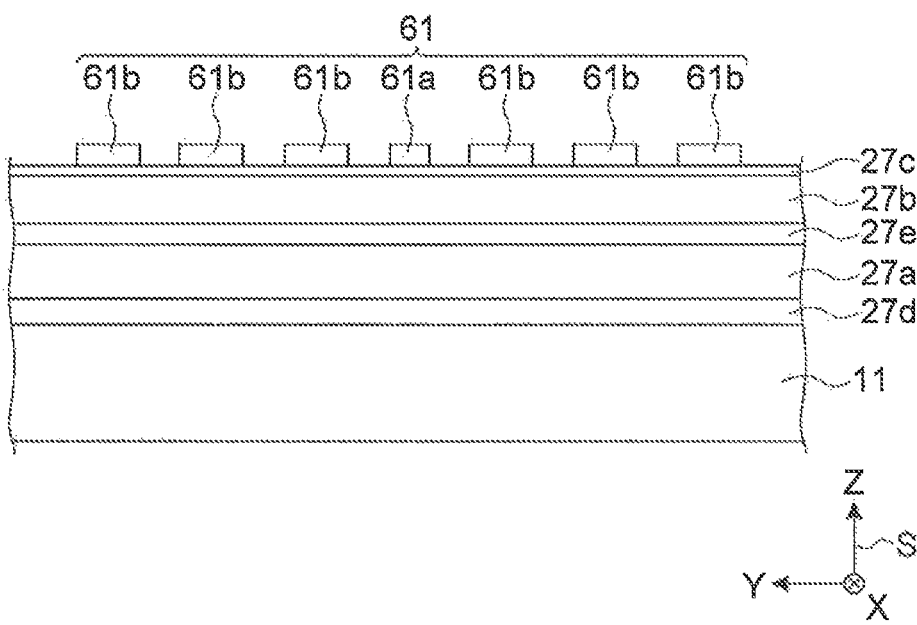

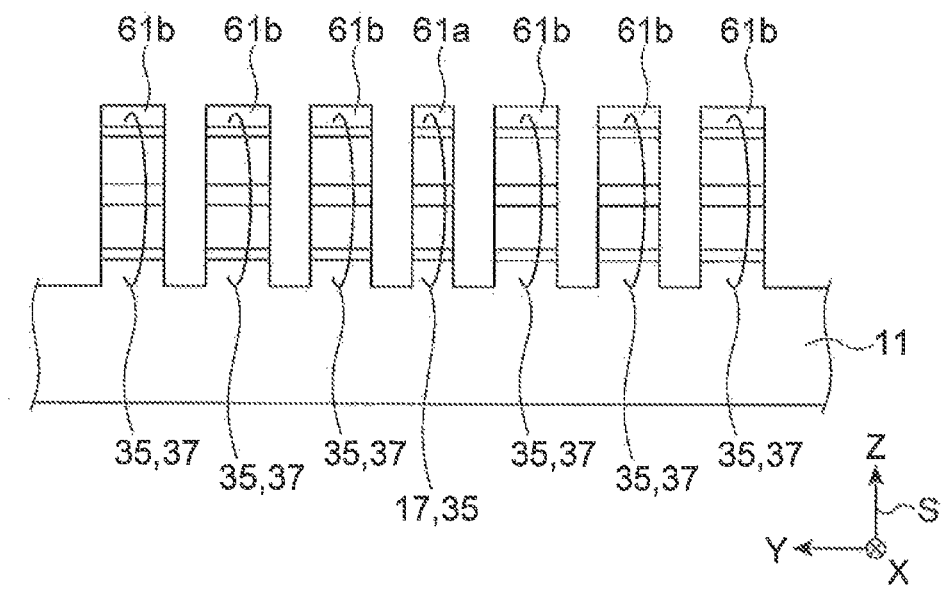
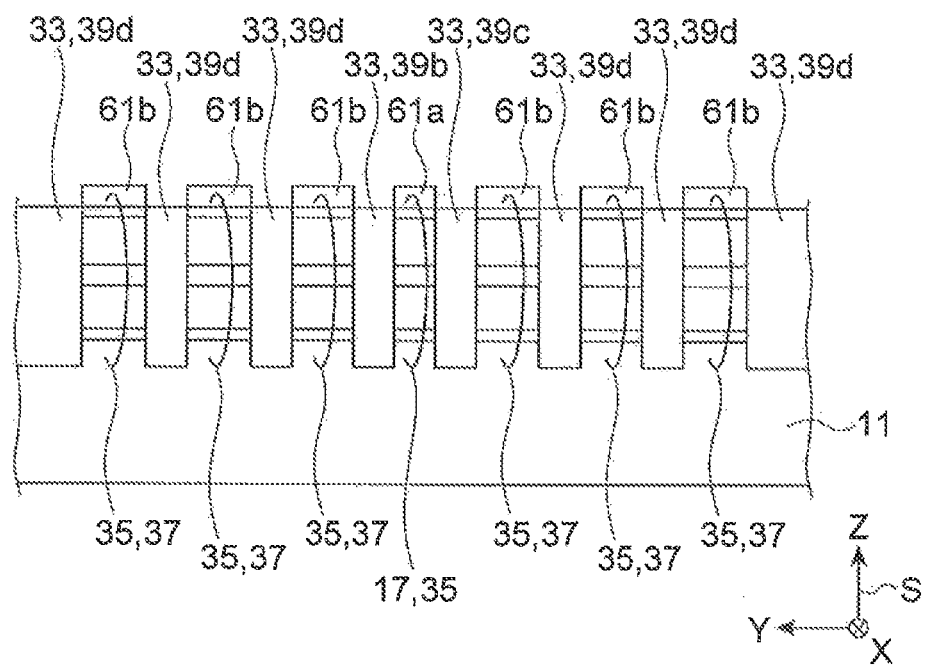

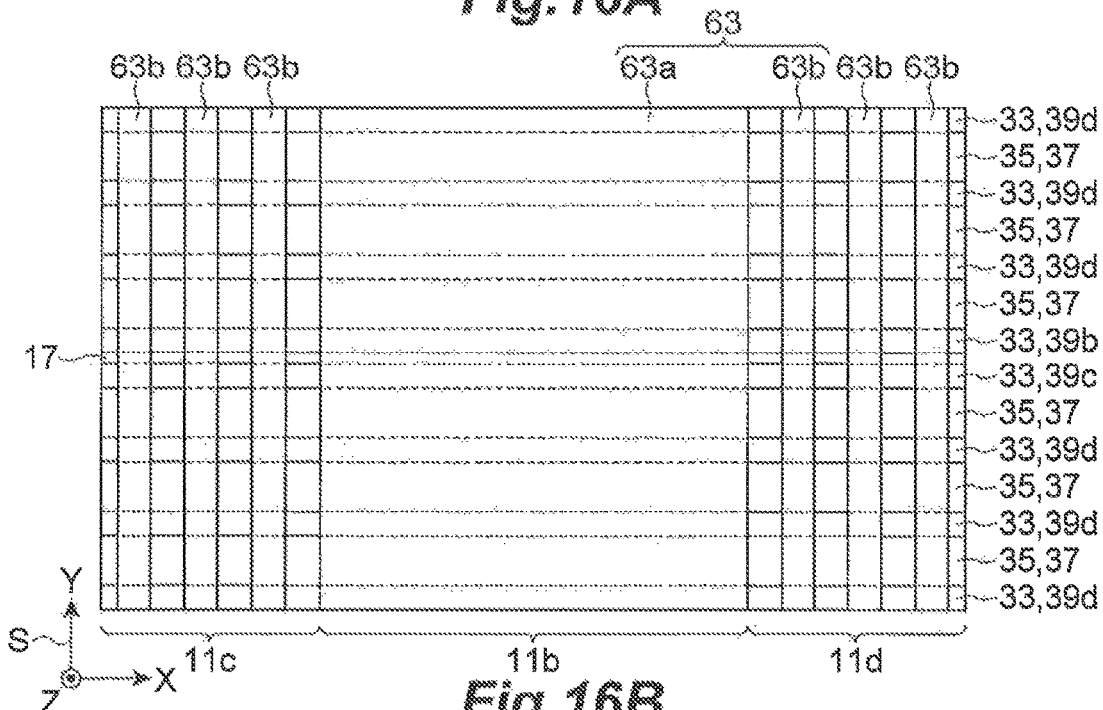
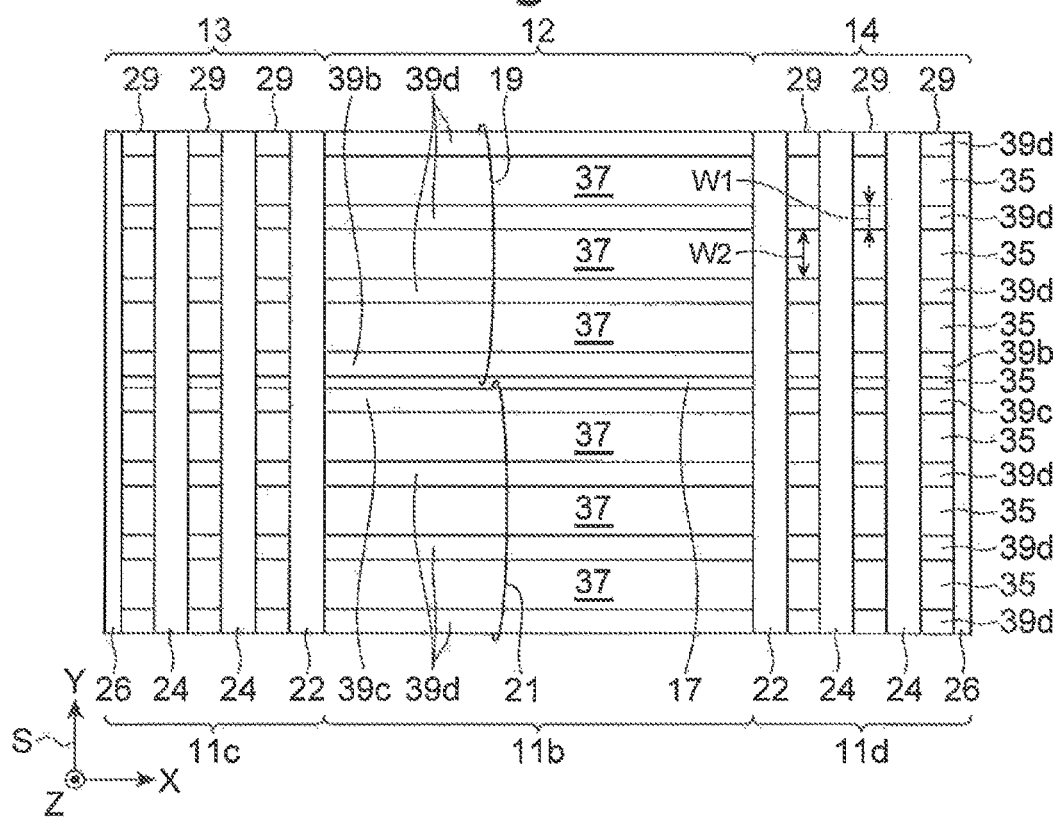

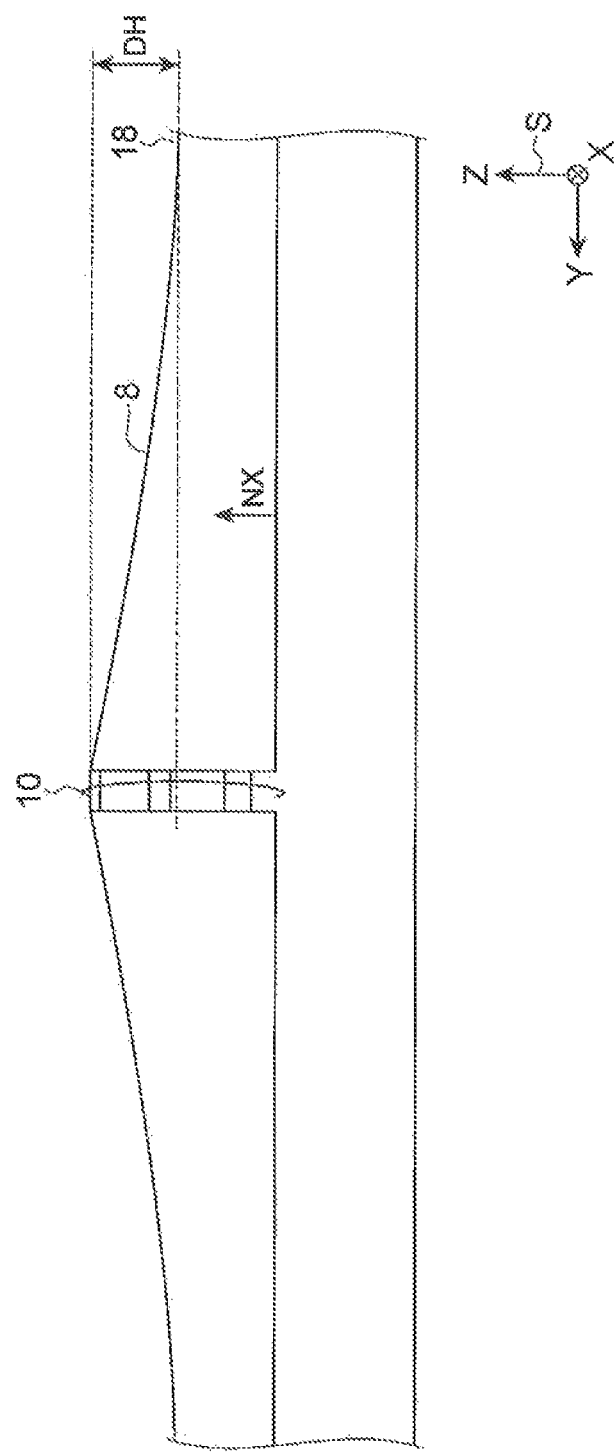

QUANTUM CASCADE SEMICONDUCTOR LASER

BACKGROUND OF THE INVENTION

Field of the Invention

The present invention relates to a quantum cascade semiconductor laser.

Related Background Art

Journal of Modern Optics, vol. 52, No. 16, pp. 2303-2308, 2005 discloses a quantum cascade semiconductor laser with a buried heterostructure.

SUMMARY OF THE INVENTION

Journal of Modern Optics, vol. 52, No. 16, pp. 2303-2308, 2005 discloses a structure including a single stripe-shaped mesa and a distributed Bragg reflection region which are provided in a single device area, and the distributed Bragg reflection region has the same width as the stripe-shaped mesa.

In a buried-heterostructure (hereinafter, abbreviated as "BH") quantum cascade semiconductor laser including a distributed Bragg reflection region having a width large than the width of a stripe-shaped mesa, a single stripe-shaped mesa is formed in each device area, and the stripe-shaped mesa is buried by regrowth to form a semiconductor region. A mask for forming a distributed Bragg reflection region is formed on the semiconductor region, and the semiconductor region is etched with the mask to form a structure for the distributed Bragg reflection region.

According to the present inventor's findings, the buried heterostructure quantum cascade semiconductor laser with a wide distributed Bragg reflection region has a top surface with a poor flatness. Research conducted by the present inventor reveals that the poor flatness of the semiconductor laser is associated with the flatness of a surface of the burying semiconductor region regrown.

In the fabrication of the buried-heterostructure quantum cascade semiconductor laser, stripe-shaped mesas for optical waveguides are arrayed on a wafer at intervals of a single device size. In this device, one stripe-shaped mesa and the adjacent stripe-shaped mesas apart from the respective side surfaces thereof are buried by semiconductor to grow a burying region between the one stripe-shaped mesa and the adjacent stripe-shaped mesas, so that the burying region is formed between two mesas among these stripe-shaped mesas. A close observation made by the present inventor reveals that the burying region has a thickness profile which decreases as a distance from one of the stripe-shaped mesas, assumes a minimum value, and subsequently increases from the minimum value toward the adjacent stripe-shaped mesa. Accordingly, the burying region has a depression between the adjacent stripe-shaped mesas. This depression extends in the same direction as the stripe-shaped mesas. In a semiconductor region in which a distributed Bragg reflection region is to be formed, the burying regions formed on both side surfaces of the stripe-shaped mesa have the thickness profiles that similarly decrease with distance from the stripe-shaped mesa.

Further research conducted by the present inventor, a variation in the thickness of the burying regions is large enough to potentially pose a significant obstacle in forming a distributed Bragg reflection region of a width larger than that of the stripe-shaped mesa. Specifically, a mask made of a material, such as a dielectric film, having the pattern that defines a high refractive index portion of a wide distributed Bragg reflection region is formed on a stripe-shaped mesa and a semiconductor region regrown so as to bury both side surfaces of the stripe-shaped mesa. As described above, the depression of the burying region on each side surface of the stripe-shaped mesa prevents an optimal exposure in patterning a resist for the mask formation from applying to both the stripe-shaped mesa and the regrown semiconductor region simultaneously because optimal exposures depend upon locations on the wafer, which makes a precise resist patterning difficult. This exposure results in non-uniform patterning of the resist. Such non-uniform exposure causes a distribution in width of the resist pattern for the mask that defines a high refractive index portion. This distribution in the resist mask, in turn, results in variations in widths, defined in the direction of the waveguide axis, of the high refractive index portion and a low refractive index portion between the adjacent high refractive index portions. A poor flatness of the burying region as described above impairs processing accuracy of the distributed Bragg reflection region to be formed in the burying region.

As seen from the above, in the formation of a wide distributed Bragg reflection region, a structure of a semiconductor region in which the distributed Bragg reflection region is to be formed is closely associated with characteristics of the distributed Bragg reflection region. Specifically, an unsatisfactory flatness of the burying region impairs processing accuracy in forming the distributed Bragg reflection region to deteriorate in-plane uniformity and reproducibility of reflectivity of the distributed Bragg reflection region, leading to a low yield.

A quantum cascade semiconductor laser according to one aspect of the present invention includes a substrate with a main surface including a waveguide area and a distributed Bragg reflection area that are arranged in a direction of a first axis; a laser region provided on the waveguide area of the substrate, the laser region including a mesa waveguide having a first side surface and a second side surface, a first burying region provided on the first side surface and the main surface of the substrate, and a second burying region provided on the second side surface and the main surface of the substrate, the first and second side surfaces of the mesa waveguide extending in the direction of the first axis; a distributed Bragg reflection region provided on the distributed Bragg reflection area of the substrate, the distributed Bragg reflection region including a semiconductor wall extending in a direction of a normal axis perpendicular to the main surface of the substrate, the semiconductor wall including a plurality of first bulk semiconductor regions and a plurality of first laminate regions that are alternately arrayed in a direction of a second axis intersecting the first axis and the normal axis; and an upper electrode provided on the laser region, the upper electrode being in contact with a top surface of the mesa waveguide. Each of the first bulk semiconductor regions includes a bulk semiconductor layer. In addition, each of the first laminate regions includes a stacked semiconductor layer having a plurality of semiconductor layers.

The above and other objects, features, and advantages according to embodiments of the present invention will be more readily understood by reference to the following detailed description of a preferred embodiment of the present invention when taken in connection with the accompanying drawings.

BRIEF DESCRIPTION OF THE DRAWINGS

FIG. 13A is a schematic diagram showing a major process in a method for fabricating a semiconductor laser according to a second example, and FIG. 13B is a schematic diagram showing a major process in the method according to the second example;

FIG. 14A is a schematic diagram showing a major process in the method according to the second example, and FIG. 14B is a schematic diagram showing a major process in the method according to the second example;

FIG. 16A is a schematic diagram showing a major process in the method according to the second example, and FIG. 16B is a schematic diagram showing a major process in the method according to the second example;

FIG. 17 is a cross sectional view showing a semiconductor region in a single die size in which a high refractive index portion of a distributed Bragg reflection region without an alternating array of bulk semiconductor regions and laminate regions is to be fabricated;

DETAILED DESCRIPTION

Figure 1:
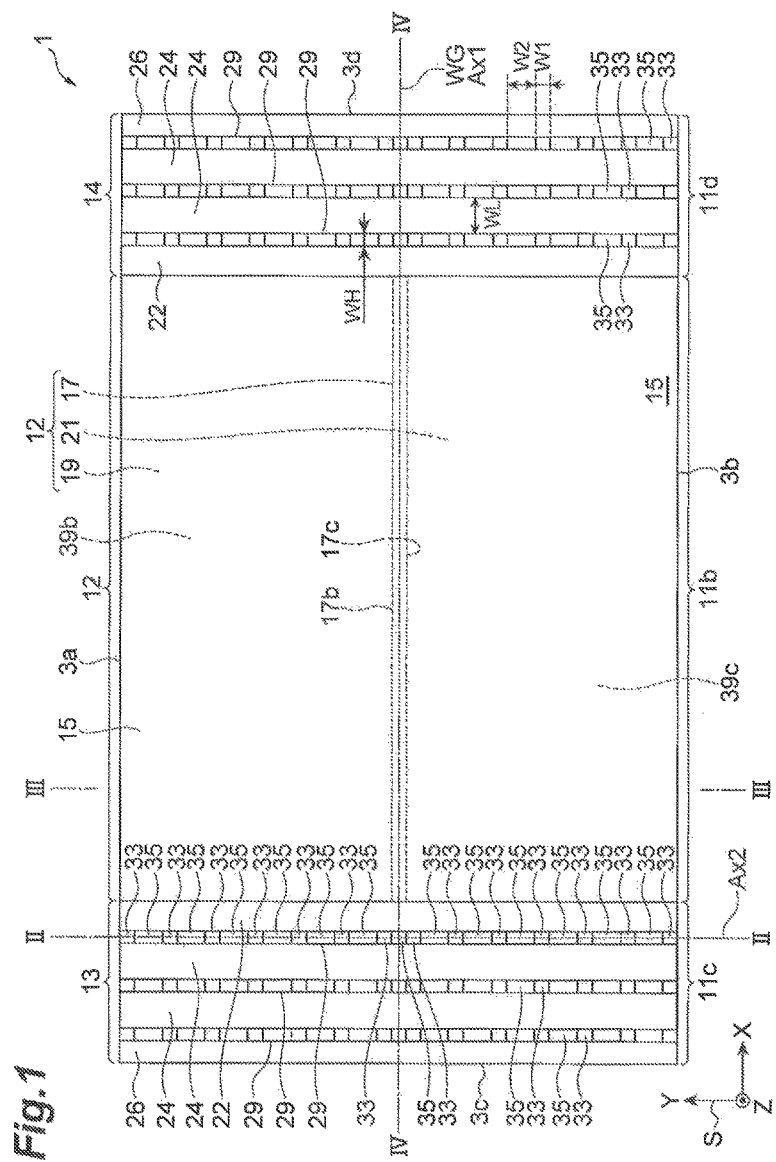
FIG. 1 is a plan view schematically showing a quantum cascade semiconductor laser according to an embodiment according to the present invention.

Several embodiments will now be described.

A quantum cascade semiconductor laser according to an embodiment includes: a substrate with a main surface including a waveguide area and a distributed Bragg reflection area that are arranged in a direction of a first axis; a laser region provided on the waveguide area of the substrate, the laser region including a mesa waveguide having a first side surface and a second side surface, a first burying region provided on the first side surface and the main surface of the substrate, and a second burying region provided on the second side surface and the main surface of the substrate, the first and second side surfaces of the mesa waveguide extending in the direction of the first axis; a distributed Bragg reflection region provided on the distributed Bragg reflection area of the substrate, the distributed Bragg reflection region including a semiconductor wall extending in a direction of a normal axis perpendicular to the main surface of the substrate, the semiconductor wall including a plurality of first bulk semiconductor regions and a plurality of first laminate regions that are alternately arrayed in a direction of a second axis intersecting the first axis and the normal axis; and an upper electrode provided on the laser region, the upper electrode being in contact with a top surface of the mesa waveguide. Each of the first bulk semiconductor regions includes a bulk semiconductor layer, and each of the first laminate regions includes a stacked semiconductor layer having a plurality of semiconductor layers.

In the quantum cascade semiconductor laser, each of the semiconductor walls for a high refractive index portion in distributed Bragg reflection includes the first bulk semiconductor regions and the first laminate regions, and each of the first laminate regions has the stacked semiconductor layer having a plurality of semiconductor layers. The first bulk semiconductor regions and the first laminate regions are alternately arrayed in the direction of the second axis. The first bulk semiconductor regions are grown so as to bury the first laminate regions to form a structure, so that each of the semiconductor walls includes the first bulk semiconductor regions provided between the first laminate regions. Each semiconductor wall has an alternating array constituted by the first bulk semiconductor regions and the first laminate regions thereby preventing the first bulk semiconductor regions from extending lengthily in the direction of the second axis. The alternating arrays in the direction of the second axis in the semiconductor walls are effective in providing the semiconductor walls along the direction of the second axis with high uniformity in height, defined in the direction of the normal axis. The improvement of uniformity in height allows the semiconductor walls for distributed Bragg reflection to have a shape with accuracy that is more favorable than semiconductor walls, located on respective side surfaces of a mesa waveguide, which are constituted by a single material equivalent to that of the first bulk semiconductor regions.

Specifically, the quantum cascade semiconductor laser includes the semiconductor walls, each of which is prepared for a high refractive index portion for distributed Bragg reflection, formed by processing the semiconductor region that includes the first laminate regions and the first bulk semiconductor regions alternately arranged in the direction of the second axis. In the formation of the semiconductor region, the first bulk semiconductor regions are grown between the first laminate regions to bury them. The burying first bulk semiconductor regions are grown on an area sectioned by the first laminate regions, and the sectioning allows thus grown semiconductor regions to have a surface with a favorable flatness. The semiconductor walls are formed on the semiconductor region by etching with a mask of material, such as, a dielectric film, having a pattern to define areas in which the semiconductor walls are to be formed, thereby providing the surface of the semiconductor region with a favorable flatness as described above, and the favorable surface flatness allows a same optimal exposure condition to be applied to resist patterning for forming the mask regardless of locations on the wafer. This less dependence with location results in that the single optimal condition can demonstrate uniform exposure independent of location, thereby improving the patterning accuracy of the resist. Consequently, the mask formed by etching with the patterned resist also has an improved processing accuracy, and etching with the mask can provide the semiconductor walls with an improved processing accuracy. This structure can increase production yield by increasing the processing accuracy of the distributed Bragg reflection region.

In the quantum cascade semiconductor laser according to an embodiment, the mesa waveguide may include a core layer and an upper cladding layer disposed on the core layer. The stacked semiconductor layer of the first laminate region may include the core layer and the upper cladding layer.

In the quantum cascade semiconductor laser according to an embodiment, preferably, each of the first and second burying regions includes a plurality of second bulk semiconductor regions and a plurality of second laminate regions that are alternately arrayed in the direction of the second axis. Each of the second laminate regions includes the stacked semiconductor layer.

In the quantum cascade semiconductor laser, each of the first and second burying regions includes a plurality of second bulk semiconductor regions and a plurality of second laminate regions. Each of the second laminate regions includes the stacked semiconductor layer. The second bulk semiconductor regions and the second laminate regions are arranged in the direction of the second axis, and the stacked semiconductor layer extends in the direction of the first axis in the second laminate regions. The second bulk semiconductor regions are formed so as to bury the second laminate regions. Specifically, the second bulk semiconductor regions are grown between the second laminate regions to bury them, so that the semiconductor region for the first burying region and the second burying region has a favorable uniformity in height along the direction of the second axis.

The alternating array of the second bulk semiconductor regions and the second laminate regions can provide an surface of the laser region with a favorable flatness, and the favorable flatness allows the quantum cascade semiconductor laser to be readily mounted in an epi-down manner. The quantum cascade semiconductor laser can be provided with an epi-down implementation of superior heat dissipation ability, and the epi-down form can avoid deterioration of characteristics of the quantum cascade semiconductor laser because of heat dissipation failure.

The second laminate regions in the first and second burying regions may be formed in the same etching process as the mesa waveguide. The second laminate regions and the mesa waveguide in a single device area are formed together. This process to form the mesa waveguide and the second laminate regions in the first and second burying regions together can reduce an area to be etched per single device size, and makes an etching rate in the etching process high. The increase in the etching rate enables formation of a high-mesa waveguide, which is needed in the fabrication of a quantum cascade semiconductor laser, to be readily performed.

In the quantum cascade semiconductor laser according to an embodiment, preferably, each of the first and second burying regions includes a first burying portion and a second burying portion that are arranged along the direction of the second axis in order from a waveguide axis toward a side surface of the quantum cascade semiconductor laser. The first burying portion includes the second laminate regions and the second bulk semiconductor regions that are alternately arrayed in the direction of the second axis. In addition, the second burying portion does not include the second laminate regions and includes the second bulk semiconductor regions extending in the direction of the second axis.

In the quantum cascade semiconductor laser, each of the first and second burying regions includes a first burying portion which is positioned nearer the waveguide axis and a second burying portion, which is positioned apart from the waveguide axis in the outside of the first burying portion. The second burying portion includes the second bulk semiconductor regions, which extend in the direction of the second axis. The second burying portion is made of a single material, such as a high-resistive bulk semiconductor. The application of the high-resistive bulk semiconductor to the second burying portion gives the first and second burying regions high resistance, and can reduce a leakage current flowing through the first and second burying region. Accordingly, characteristics of the quantum cascade semiconductor laser can be further improved.

In the quantum cascade semiconductor laser according to an embodiment, the second bulk semiconductor regions may include an undoped or semi-insulating semiconductor.

In the quantum cascade semiconductor laser, the second bulk semiconductor regions include a first confining section and a second confining section, each including the high-resistive material, which are in contact with the first side surface and the second side surface of the mesa waveguide, respectively. The first and second confining sections in the second bulk semiconductor regions favorably function as current blocking layers for confining current into the mesa waveguide. The first burying region and the second burying region which are apart from the mesa waveguide include the second bulk semiconductor regions with high-resistivity as described above, and the high resistance of these semiconductor regions allows the first burying region and the second burying region to exhibit high resistance as a whole. The high-resistive burying regions can reduce a leakage current flowing through the first and second burying regions which bury the mesa waveguide.

The quantum cascade semiconductor laser according to an embodiment may further include a first semiconductor capping layer provided on the first bulk semiconductor regions in the semiconductor walls. The first semiconductor capping layer may be in contact with the first bulk semiconductor regions of the semiconductor walls. The first semiconductor capping layer may be made of the same material as that of the first bulk semiconductor regions.

In the quantum cascade semiconductor laser, the first bulk semiconductor regions of the semiconductor walls are connected to each other by the first semiconductor capping layer made of the same material as the first bulk semiconductor regions. The first bulk semiconductor regions and the first semiconductor capping layer made of the same material allow the first bulk semiconductor regions and the first semiconductor capping layer to be crystallographically integrated with each other, thereby constituting a structure made of a single material. Accordingly, this structure makes the strength of the semiconductor walls high. The first semiconductor capping layer can reduce the occurrence of damage to the semiconductor walls for distributed Bragg reflection and can improve the yield and durability of the device.

In the quantum cascade semiconductor laser according to an embodiment, preferably, the semiconductor wall includes a first portion and a second portion that are arranged along a direction of the second axis in order from a waveguide axis toward a side surface of the quantum cascade semiconductor laser. The first portion includes the first laminate regions and the first bulk semiconductor regions that are alternately arrayed in the direction of the second axis. The second portion does not include the first laminate regions and includes the first bulk semiconductor regions.

In the quantum cascade semiconductor laser, the semiconductor walls include a first portion positioned close to the waveguide axis and a second portion apart from the waveguide axis, which is disposed on the outside of the first portion. The second portion includes the first bulk semiconductor regions, which extend in the direction of the second axis. The second portion does not include the first laminate regions and is made of a bulk semiconductor. The application of a bulk semiconductor to the second portion reinforces the mechanical strength of the second portion in the semiconductor walls, and makes the semiconductor walls for distributed Bragg reflection less susceptible to damage.

The quantum cascade semiconductor laser according to an embodiment may further include an insulating film made of a dielectric material, the insulating film being provided between the upper electrode and the first and second burying regions.

In the quantum cascade semiconductor laser, the dielectric insulating film has superior durability and a superior insulating property. The insulating film can be readily formed using a general reactor for dielectric film deposition, and the dielectric insulating film can be readily introduced into a manufacturing process.

The quantum cascade semiconductor laser according to an embodiment may further include a second semiconductor capping layer made of an undoped semiconductor or a semi-insulating semiconductor, the second semiconductor capping layer being provided between the upper electrode and the first and second burying regions.

In the quantum cascade semiconductor laser, the second semiconductor capping layer is made of a semi-insulating semiconductor or an undoped semiconductor, which has excellent thermal conductivity. The second semiconductor capping layer is grown on a surface of underlying semiconductor region (for example, the mesa waveguide and the first and second burying regions) so as to reduce roughness of the surface of the underlying semiconductor region. This growth allows the laser region to have an excellent surface flatness, as compared to a device including a dielectric insulating film is used. Such an improvement in the surface flatness of the laser region can enhances heat dissipation of the device during an epi-down mounting process, so that the enhanced heat dissipation can more readily avoid deterioration of characteristics of the quantum cascade semiconductor laser due to heat dissipation failure.

The quantum cascade semiconductor laser according to an embodiment may further include a first reinforcing section connecting a first wall and a second wall among the semiconductor walls with each other.

In the quantum cascade semiconductor laser, the semiconductor walls or, more specifically, the first wall and the second wall among the semiconductor walls are connected to each other via the first reinforcing section so as to integrate the first reinforcing section, the first wall and the second wall. This reinforcement structure can make the mechanical strength of the distributed Bragg reflection region high. The structure allows the distributed Bragg reflection region to be less susceptible to damage, and can further improve fabricating yield and durability of the device.

In the quantum cascade semiconductor laser according to an embodiment, preferably, the first wall includes a third portion that is connected to the first reinforcing section. The second wall includes a fourth portion that is connected to the first reinforcing section. In addition, the first reinforcing section, the third portion and the fourth portion are made of the same material.

In the quantum cascade semiconductor laser, the first reinforcing section, the third portion, and the fourth portion made of the same material allow the first reinforcing section, the third portion, and the fourth portion to be crystallographically integrated with each other, thereby constituting a structure made of a single material. Accordingly, this structure increases the strength of the distributed Bragg reflection region effectively. The first reinforcing section, the third portion and the fourth portion made of the same material also allow the first reinforcing section, the third portion and the fourth portion to be formed together. This formation can simplify the fabricating process of the quantum cascade semiconductor laser.

The quantum cascade semiconductor laser according to an embodiment may further include a second reinforcing section connecting each of the first and second burying regions to the corresponding semiconductor wall.

In the quantum cascade semiconductor laser, the second reinforcing section connects the semiconductor walls of the distributed Bragg reflection region to the laser region, thereby forming an integrated structure. The integrated structure can make the mechanical strength of the distributed Bragg reflection region high, thereby avoiding damage to the distributed Bragg reflection region. The second reinforcing section can make the yield and durability of the device better.

In the quantum cascade semiconductor laser according to an embodiment, preferably, the semiconductor walls includes a connecting section that is connected to the second reinforcing section. The second reinforcing section and the connecting section of the semiconductor wall are made of the same material.

In the quantum cascade semiconductor laser, the second reinforcing section and the connecting section of the semiconductor wall made of the same material allow the second reinforcing section and the connecting section to be crystallographically integrated with each other, thereby constituting a structure made of a single material. The integrated structure can increase the strength of the distributed Bragg reflection region more effectively, and allows the connecting section of the semiconductor walls and the second reinforcing section to be formed together. This formation can make the fabricating process of the quantum cascade semiconductor laser simplified.

In the quantum cascade semiconductor laser according to an embodiment, preferably, the first burying region includes a third burying portion that is connected to the second reinforcing section. The second burying region includes a fourth burying portion that is connected to the second reinforcing section. In addition, the second reinforcing section, the third burying portion, and the fourth burying portion are made of the same material.

In the quantum cascade semiconductor laser, the second reinforcing section, the third burying portion and the fourth burying portion made of the same material allow the second reinforcing section, the third burying portion and the fourth burying portion to be crystallographically integrated with each other, thereby constituting a structure made of a single material. The integrated structure can increase the strength of the distributed Bragg reflection region more effectively, and allows the second reinforcing section, the third burying portion and the fourth burying portion to be formed together. This formation can make the fabricating process of the quantum cascade semiconductor laser simplified.

In the quantum cascade semiconductor laser according to an embodiment, the semiconductor wall may have a length shorter than a width of the substrate in the direction of the second axis.

In the quantum cascade semiconductor laser, the length of the semiconductor wall is shorter than the width of the device. Accordingly, the length of the semiconductor walls is made shorter than the size of the single device section in the fabrication of the quantum cascade semiconductor laser, so that in-plane uniformity and reproducibility are improved in etching for forming the semiconductor walls for distributed Bragg reflection. The shorter semiconductor walls of the quantum cascade semiconductor laser can avoid a decrease in production yield due to damage of the semiconductor walls caused in the device separation process, and can enhance the mechanical strength of the semiconductor walls to make the semiconductor walls less susceptible to damage.

In the quantum cascade semiconductor laser according to an embodiment, the first bulk semiconductor regions may include an undoped or semi-insulating semiconductor.

In the quantum cascade semiconductor laser, optical absorption caused by free carriers in undoped semiconductors and/or semi-insulating semiconductors is very small in a mid-infrared wavelength region, which results that absorption of light caused by the semiconductor walls is made small in the distributed Bragg reflection region.

In the quantum cascade semiconductor laser according to an embodiment, the upper cladding layer may be made of InP.

In the quantum cascade semiconductor laser, the above InP exhibit little light absorption of a mid-infrared light and is transparent to it, and accordingly is suitable as a material of cladding layers. In addition, since InP is a binary mixed alloy and has a lattice constant matching that of an InP substrate, InP can be readily grown on the InP substrate. InP has a high thermal conductivity, which allows an cladding layer of InP to have favorable dissipation of heat from a core layer, and can contribute to improvement in temperature characteristics of the quantum cascade semiconductor laser.

In the quantum cascade semiconductor laser according to an embodiment, preferably, the core layer includes active layers and injection layers, and the active layers and the injection layers are alternately arrayed. The active layers are provided for a light-emitting region, and the injection layers are provided for the injection of carriers into the respective active layers.

In the quantum cascade semiconductor laser, a cascading multiple connection of the injection layers and the active layers is useful as a core structure of the quantum cascade semiconductor laser. The serial connection of the active layers and the injection layers each of which is provided between active layers allows electrons to continuously flow into an adjacent active layer in a seamless manner and to transit between sub-bands of the conduction band therein, thereby causing favorable lasing in the quantum cascade laser.

In the quantum cascade semiconductor laser according to an embodiment, each of the active layers and the injection layers may include a GaInAs/AlInAs superlattice.

In the quantum cascade semiconductor laser, since the superlattice is capable of providing a transition between the sub-bands in the conduction band in a mid-infrared wavelength region, and is favorable as a semiconductor material for a core layer of a mid-infrared quantum cascade semiconductor laser.

In the quantum cascade semiconductor laser according to an embodiment, the substrate may be made of an n-type InP.

In the quantum cascade semiconductor laser, the semiconductor layers constituting the quantum cascade semiconductor laser each have respective lattice constants which are close to the lattice constant of InP. Using an InP substrate as the substrate for the quantum cascade semiconductor laser allows the semiconductor layers in the quantum cascade semiconductor laser to be grown with favorable crystalline quality. The InP substrate is also transparent to light in a mid-infrared wavelength region without substantial light absorption, resulting in that the InP substrate can be used as a lower cladding region.

In the quantum cascade semiconductor laser according to an embodiment, preferably, the mesa waveguide is separated from the semiconductor walls to form a gap, and the adjacent semiconductor walls are separated from each other to form another gap.

In the quantum cascade semiconductor laser, the semiconductor walls are arranged in a distributed Bragg reflection area to constitute arrayed high refractive index portions, and the gap between the mesa waveguide and the semiconductor walls and the other gap between the adjacent semiconductor walls are arranged in the distributed Bragg reflection area to constitute arrayed low refractive index portions.

The teachings of the present invention can be easily understood by referring to the below-described detailed description and accompanying exemplary drawings. Embodiments of a quantum cascade semiconductor laser according to an embodiment and a method of fabricating the quantum cascade semiconductor laser will be described below. If possible, same portions will be denoted by same reference symbols. Moreover, respective examples which will be presented below exemplify a distributed feedback (hereinafter, abbreviated as "DFB") quantum cascade semiconductor laser with a laser region including a diffraction grating layer for single mode lasing.

Figure 2:
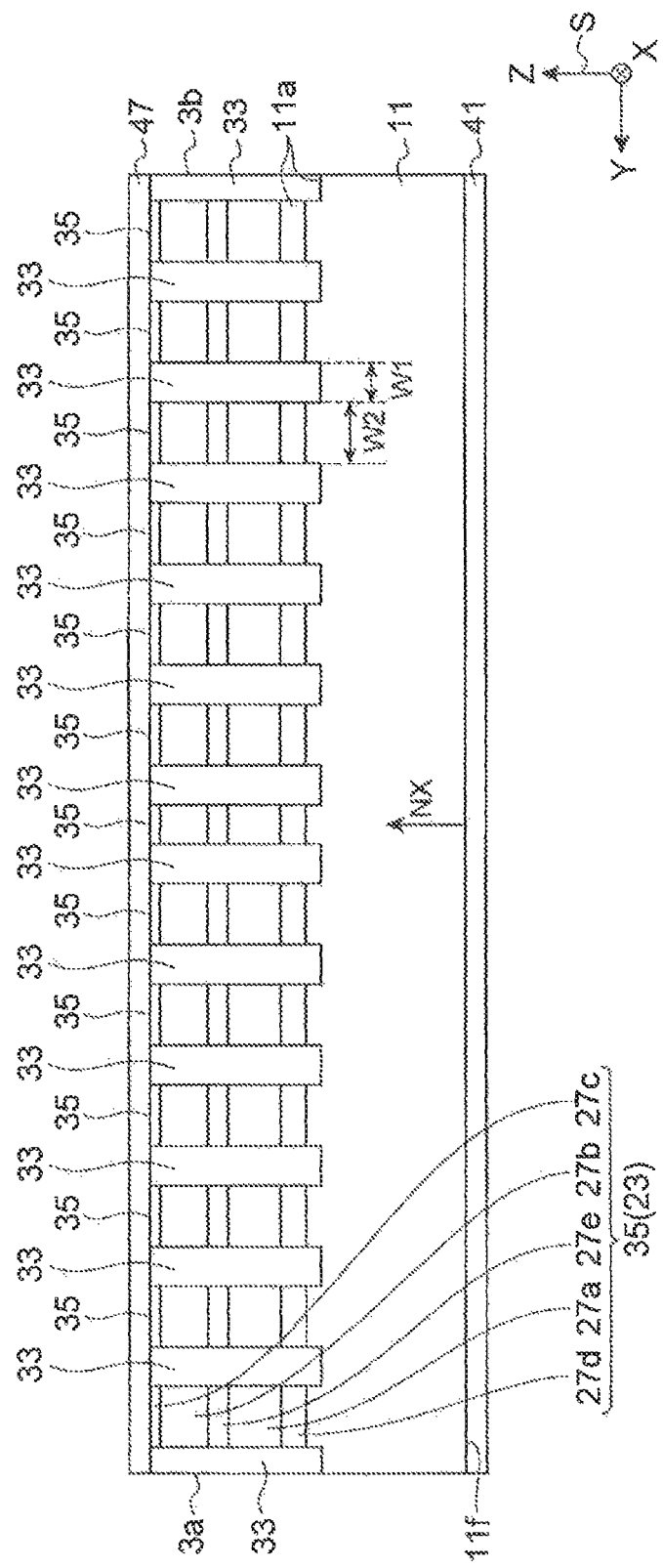
FIG. 2 is a schematic cross sectional view, taken along line II-II in FIG. 1, showing the quantum cascade semiconductor laser.
Figure 3:
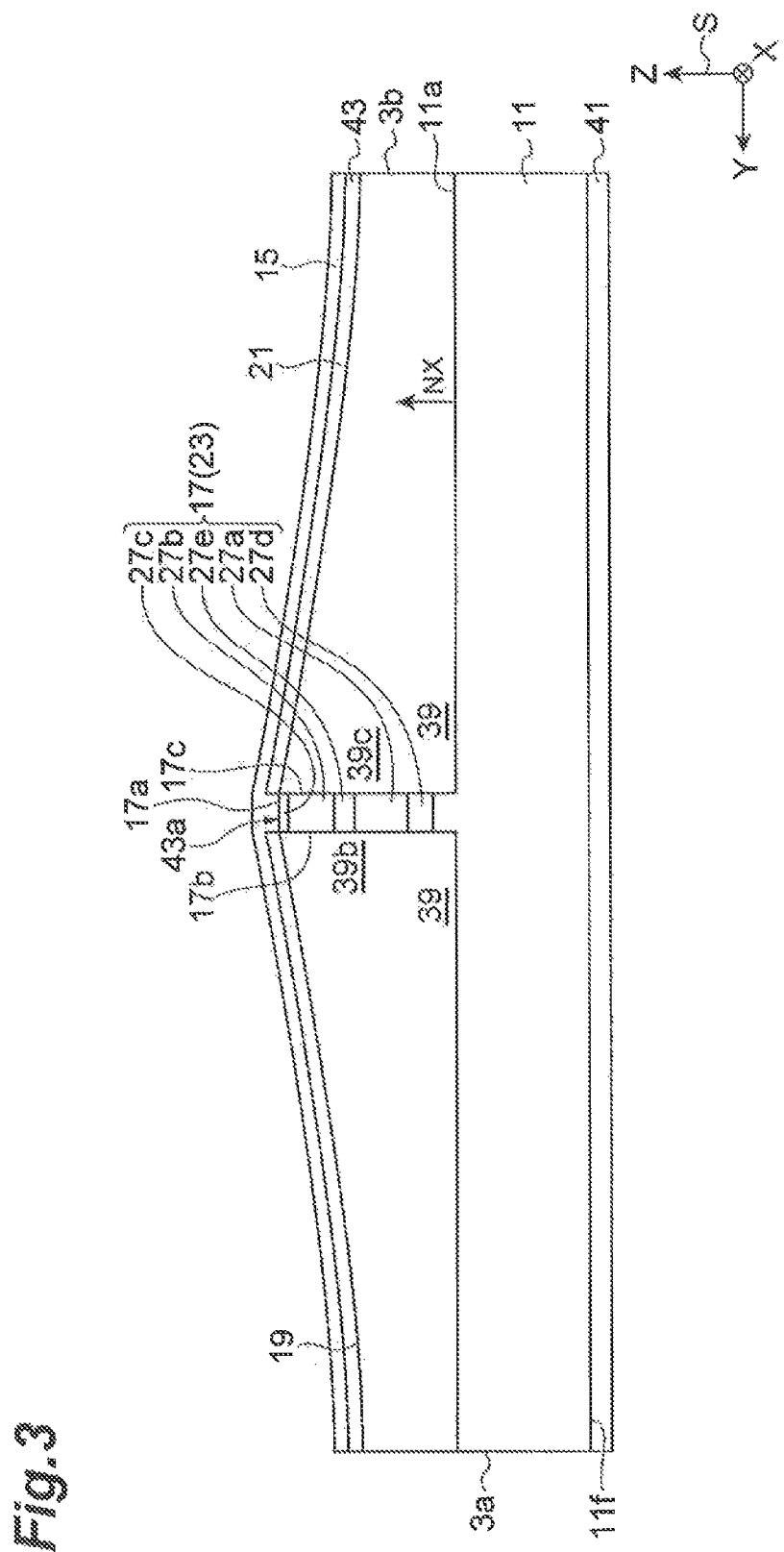
FIG. 3 is a schematic cross sectional view, taken along line III-III in FIG. 1, showing the quantum cascade semiconductor laser.
Figure 4:
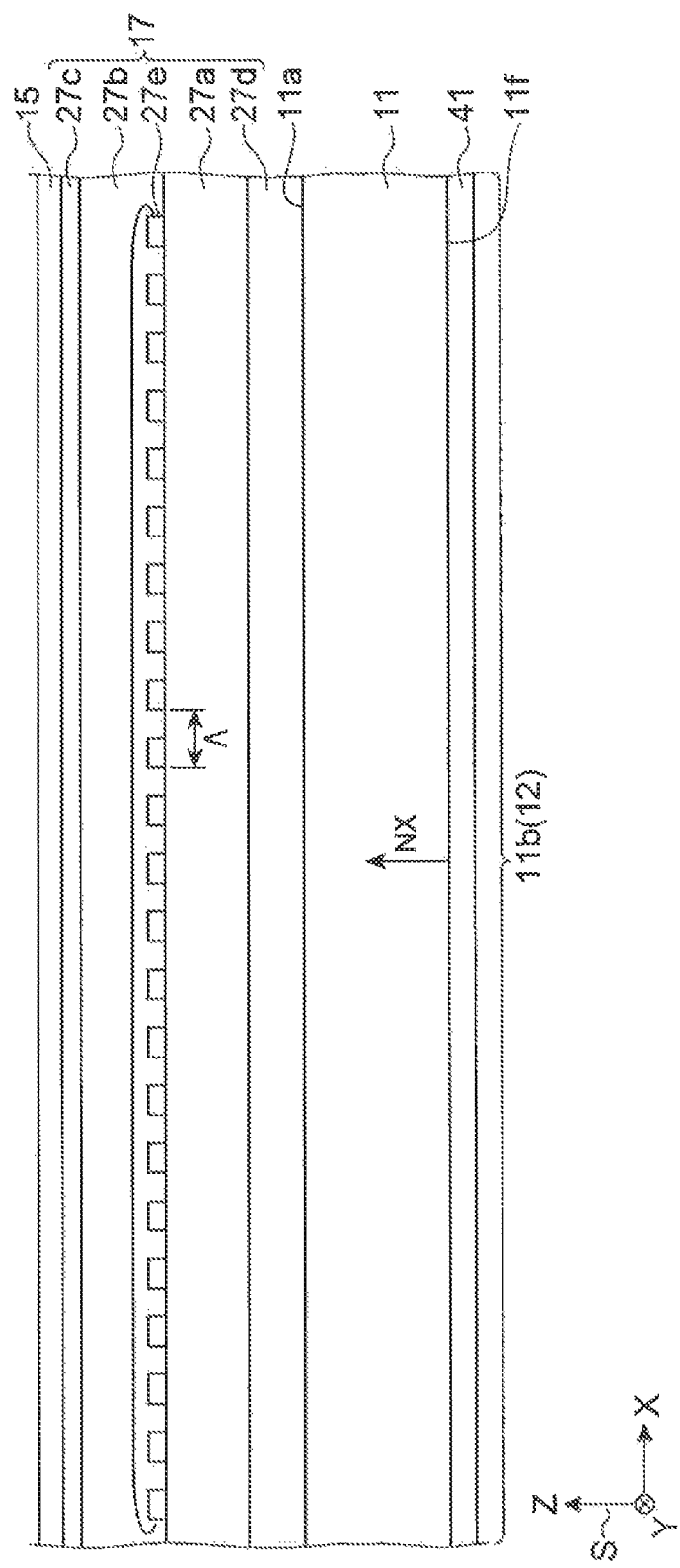
FIG. 4 is a schematic cross sectional view, taken along line IV-IV in FIG. 1, showing a laser region of the quantum cascade semiconductor laser.

FIG. 1 is a schematic plan view showing a quantum cascade semiconductor laser according to an embodiment. FIG. 2 is a schematic cross sectional view, taken along line II-II in FIG. 1, showing the quantum cascade semiconductor laser. FIG. 3 is a schematic cross sectional view, taken along line III-III in FIG. 1, showing the quantum cascade semiconductor laser. FIG. 4 is a schematic cross sectional, taken along line IV-IV in FIG. 1, showing a laser region of a quantum cascade semiconductor laser 1.

Referring to FIGS. 1 to 3, the quantum cascade semiconductor laser 1 includes a substrate 11, a laser region 12, and distributed Bragg reflection regions 13 and 14. The substrate 11 includes a main surface 11a, and the main surface 11a includes a waveguide area 11b and distributed Bragg reflection areas 11c and 11d which are arrayed in a direction (X direction) of a first axis Ax1. The laser region 12 is provided on the waveguide area 11b of the substrate 11. The distributed Bragg reflection regions 13 and 14 are provided on the distributed Bragg reflection areas 11c and 11d, respectively. The distributed Bragg reflection regions 13 and 14 include device end faces 3c and 3d, respectively. The following description will focus on the distributed Bragg reflection region 13 on the distributed Bragg reflection area 11c of the substrate 11, and the description also applies to the distributed Bragg reflection region 14 on the distributed Bragg reflection area 11d.

The laser region 12 includes a mesa waveguide 17, a first burying region 19, and a second burying region 21. The mesa waveguide 17 extends along a waveguide axis WG that is parallel to the first axis Ax1. The mesa waveguide 17 includes a first side surface 17b and a second side surface 17c which extend in the direction of the first axis Ax1. The first burying region 19 is provided on the first side surface 17b of the mesa waveguide 17 and the main surface 11a of the substrate 11, and the second burying region 21 is also provided on the second side surface 17c of the mesa waveguide 17 and the main surface 11a of the substrate 11.

The distributed Bragg reflection region 13 includes one or more semiconductor walls 29 for distributed Bragg reflection, and each semiconductor wall 29 extends from the main surface 11a of the substrate 11 in a direction of an axis NX normal to the main surface 11a (the Z axis in an orthogonal coordinate system S). The semiconductor walls 29 are arrayed in the direction of the first axis Ax1 in the distributed Bragg reflection area 11c, and the present embodiment shows the distributed Bragg reflection region 13 containing three semiconductor walls 29. Each semiconductor wall 29 includes first bulk semiconductor regions 33 and first laminate regions 35. The first bulk semiconductor region 33 and first laminate regions 35 of each semiconductor wall 29 are alternately arrayed in a direction (Y direction) of a second axis Ax2 that intersects the first axis Ax1 and the normal axis NX. In the present embodiment, the alternate arrangement of the first bulk semiconductor regions 33 and the first laminate regions 35 extends in the direction of the second axis Ax2 from one of side edges 3a and 3b to the other in the quantum cascade semiconductor laser 1.

In the quantum cascade semiconductor laser 1, each of the semiconductor walls 29 for distributed Bragg reflection includes the first bulk semiconductor regions 33 and the first laminate regions 35, and the mesa waveguide 17 and the first laminate regions 35 have a stacked semiconductor layer 23. The first bulk semiconductor regions 33 and the first laminate regions 35 are alternately arrayed in the direction of the second axis Ax2. The first bulk semiconductor regions 33 is made from semiconductor grown so as to bury the first laminate regions 35, and the first bulk semiconductor regions 33 are provided between the first laminate regions 35 in each of the semiconductor walls 29. Accordingly, the semiconductor walls 29 include an alternating arrangement constituted by the first bulk semiconductor regions 33 and the first laminate regions 35, and the alternating arrangement prevents the first bulk semiconductor regions 33, from extending widely in the direction of the second axis Ax2. The alternate arrangement in each of the semiconductor walls 29 that extends in the direction of the second axis Ax2 is effective in making the top of each semiconductor wall 29 along the direction of the second axis Ax2 even in height, which is defined in the direction of the normal axis NX. The desired evenness in height allows the processing accuracy in forming the semiconductor walls 29 to be more favorable than a semiconductor wall which is made of bulk semiconductor alone similar to material of the first bulk semiconductor regions, thereby making the distributed Bragg reflection region 13 highly reflective.

In addition, in the quantum cascade semiconductor laser 1, the semiconductor walls 29 for distributed Bragg reflection are formed by processing a semiconductor region that includes semiconductor portions for the first laminate regions 35 and the first bulk semiconductor regions 33, which are to be alternately arranged in the direction of the second axis Ax2. In the formation of the semiconductor region, bulk semiconductor portions for the first bulk semiconductor regions 33 are formed by burying growth between the semiconductor portions for the first laminate regions 35. The bulk semiconductor portions in the first bulk semiconductor region 33 thus formed by embedding growth are separated by the semiconductor portions for the first laminate regions 35, so that the semiconductor region has a top surface with a favorable evenness. The semiconductor walls 29 are formed by etching with a mask, such a dielectric film, that defines a pattern for the semiconductor walls 29 to be formed from the semiconductor region, and the mask is formed on the semiconductor region of the surface with a favorable flatness as described above, so that optimal exposure conditions in patterning a resist for forming the mask are almost the same over the surface of the semiconductor region independent of location. The above semiconductor region allows uniform exposure under an optimal condition independent of location, thereby improving patterning accuracy of the resist. Specifically, etching with the resist mask can provide the mask with an improved processing accuracy, and the mask with precise dimensions also allows the etching process to form the semiconductor walls 29 in a precise dimension. This process prevents the yield from decreasing because of processing inaccuracy of the distributed Bragg reflection regions 13 and 14.

The mesa waveguide 17 and the first laminate regions 35 each have the stacked semiconductor layer 23. The stacked semiconductor layer 23 includes a first semiconductor layer 27a and a second semiconductor layer 27b. The first semiconductor layer 27a serves as a core layer and the second semiconductor layer 27b serves as an upper cladding layer in the embodiment. In the present example, the stacked semiconductor layer 23 further includes a third semiconductor layer 27c for a contact layer, a fourth semiconductor layer 27d for a lower cladding layer, and a fifth semiconductor layer 27e for a diffraction grating layer. The fourth semiconductor layer 27d (the lower cladding layer), the first semiconductor layer 27a (the core layer), the fifth semiconductor layer 27e (the diffraction grating layer), the second semiconductor layer 27b (the upper cladding layer), and the third semiconductor layer 27c (the contact layer) are arranged in order in the direction of the normal axis NX.

The end portion of the mesa waveguide 17 is provided so as to be apart from the semiconductor walls 29, and in the present example, a gap 22 is formed between the end portion of the mesa waveguide 17 and the side surface of the nearest wall among the semiconductor walls 29. The semiconductor walls 29 are provided separated from each other and, in the present example, another gap 24 is provided between the semiconductor walls 29. The semiconductor walls 29 each are provided in the distributed Bragg reflection area 11c to constitute high refractive index portions, and the gap 22 between the mesa waveguide 17 and the nearest semiconductor wall 29, the other gap 24 between the semiconductor walls 29, and a spacing 26 between the end 3c and the semiconductor wall 29 closest to the end 3c are provided in the distributed Bragg reflection area 11c to constitute low refractive index portions. Accordingly, the distributed Bragg reflection region 13 includes an alternating arrangement of high refractive index portions and low refractive index portions. In addition, the high refractive index portions and the low refractive index portions have widths of WH and WL defined in the direction of the first axis Ax1, respectively.

In the quantum cascade semiconductor laser 1, it is preferable that the first bulk semiconductor regions 33 include an undoped semiconductor and/or a semi-insulating semiconductor. The undoped semiconductor and semi-insulating semiconductor exhibit a slight light absorption due to free carriers in a mid-infrared wavelength region, and can reduce the absorption of light propagating in the semiconductor walls 29 of the distributed Bragg reflection region 13.

The quantum cascade semiconductor laser 1 includes an upper electrode 15 which is in contact with an upper surface 17a of the mesa waveguide 17, and a lower electrode 41 provided on a back surface 11f of the substrate 11. The upper electrode 15 is made of a material which enables ohmic contact with the upper surface 17a of the mesa waveguide 17. The lower electrode 41 is made of a material which enables ohmic contact with the back surface 11f of the substrate 11. In addition, the quantum cascade semiconductor laser 1 can include an isolating layer 43 provided between the upper electrode 15 and the first and second burying region 19 and 21.

When necessary, the quantum cascade semiconductor laser 1 can further include a first semiconductor capping layer 47 which extends over tops of the semiconductor walls 29. The first semiconductor capping layer 47 is in contact with the first bulk semiconductor regions 33 of the semiconductor walls 29. It is preferable that the first semiconductor capping layer 47 be made of the same material as that of the first bulk semiconductor regions 33. In the quantum cascade semiconductor laser 1, the first bulk semiconductor regions 33 of the semiconductor walls 29 are connected to each other by the first semiconductor capping layer 47 made of the same material as that of the first bulk semiconductor regions 33. The first bulk semiconductor regions 33 and the first semiconductor capping layer 47 that are made of the same material are crystallographically integrated with each other to constitute a structure made of a single material. This structure makes strength of the semiconductor walls 29 increased. The first semiconductor capping layer 47 can reduce damage to the semiconductor walls 29 for distributed Bragg reflection and can improve the production yield and durability of the device.

At least one of a dielectric insulating film and a semiconductor capping layer that act as the insulating layer 43 can be provided between the upper electrode 15 and the first and second burying regions 19 and 21. The insulating layer 43 includes an opening 43a positioned on the upper surface 17a of the mesa waveguide 17. The upper electrode 15 is in contact with the upper surface 17a of the mesa waveguide 17 via the opening 43a.

In the quantum cascade semiconductor laser 1, the insulating layer 43 can include an insulating film made of a dielectric material provided between the upper electrode 15 and the first and second burying regions 19 and 21. The insulating film made of a dielectric material is provided between the first and second burying region 19, 21 and the upper electrode 15. In this quantum cascade semiconductor laser 1, the insulating film has a superior durability and a superior insulating property. In addition, the insulating film can be readily formed using a general apparatus for dielectric film deposition, and the dielectric insulating film can be readily introduced into a manufacturing process. The insulating film can include at least one of $SiO_2$, SiON, SiN, alumina, BCB resin, or polyimide resin.

In addition, in the quantum cascade semiconductor laser 1, the insulating layer 43 can include a second semiconductor capping layer provided between the upper electrode 15 and the first and second burying region 19 and 21. The second semiconductor capping layer can include an undoped semiconductor or a semi-insulating semiconductor. In this quantum cascade semiconductor laser 1, the second semiconductor capping layer is made of a semi-insulating semiconductor or an undoped semiconductor, and these semiconductors have favorable thermal conductivity. In addition, the second semiconductor capping layer grows on the surface of an underlying semiconductor region (the mesa waveguide 17 and the first and second burying regions 19 and 21) so as to reduce irregularities of the surface of the underlying semiconductor region. As compared to a quantum cascade semiconductor laser in which the dielectric insulating film is used, the laser region 12 has an improved surface flatness. Such an improvement in the surface flatness of the laser region 12 is effective in facilitate heat dissipation in the device during epi-down mounting process, and can readily prevent heat dissipation failure from deteriorating the characteristics of the quantum cascade semiconductor laser.

An example of the quantum cascade semiconductor laser 1 is as follows.
Substrate 11: n-type InP substrate.
First semiconductor layer 27a (core layer): structure in which active layers and injection layers are alternately laminated.
Active layer 28a: superlattice structure of GaInAs/AlInAs.
Injection layer 28b: superlattice structure of GaInAs/AlInAs.
Second semiconductor layer 27b (upper cladding layer): n-type InP.
Third semiconductor layer 27c (contact layer): n-type GaInAs.
Fourth semiconductor layer 27d (lower cladding layer): n-type InP.
Fifth semiconductor layer 27e (diffraction grating layer): undoped or n-type GaInAs.
First bulk semiconductor region 33: semi-insulating InP, undoped InP.
Upper electrode 15 and lower electrode 41: Ti/Au, Ge/Au.

In a preferred example, the substrate 11 includes an n-type InP substrate. In the quantum cascade semiconductor laser 1, semiconductor layers constituting the quantum cascade semiconductor laser 1 have respective lattice constants close to the lattice constant of InP, so that the application of an InP substrate enables the layers to grow thereon with favorable crystalline quality. In addition, the InP substrate is transparent to a light in a mid-infrared wavelength region, so that InP of the substrate functions as a lower cladding region.

Furthermore, the upper cladding layer provided by the second semiconductor layer 27b may include InP. In this quantum cascade semiconductor laser 1, InP is transparent to a light in a mid-infrared wavelength region, so that InP is suitable as material of cladding layers. In addition, InP is a binary mixed crystal and the lattice thereof matches with that of an InP substrate, so that InP can be readily grown thereon. Furthermore, InP has favorable thermal conductivity, so that heat from the core layer can be favorably dissipated via InP of a cladding layer. As seen from the above, the InP cladding layer improves temperature characteristics of the quantum cascade semiconductor laser. The lower cladding layer 27d may also be configured to include InP.

The core layer that the first semiconductor layer 27a provides includes active layers 28a each of which acts as a light-emitting region, and injection layers 28b for injecting a carrier into the active layers 28a. The active layers 28a and the injection layers 28b are alternately arranged. In the quantum cascade semiconductor laser 1, a multi-tier arrangement of the active layers 28a and the injection layers 28b is applicable to the core layer of the quantum cascade semiconductor laser 1. The active layers 28a are mutually connected via the respective injection layers 28b to be provided between the adjacent active layers 28a, so that electrons continuously flow from one active layer 28a to another active layer 28a adjacent thereto in a seamless manner to cause electron transition between sub-bands of the conduction band. This carrier transition enables the quantum cascade semiconductor laser to lase favorably. For example, each of the active layers 28a and the injection layers 28b may be constituted by a GaInAs/AlInAs superlattice structure. In this quantum cascade semiconductor laser 1, the superlattice arrangement is capable of causing transition of electrons between sub-bands in the conduction band, and the sub-band transition corresponds to a wavelength in the mid-infrared region. As a result, the superlattice arrangement of this kind is suitable as a core layer for mid-infrared laser oscillation.

Examples of structures for the first burying region 19 and examples of structures for the second burying region 21 will now be described.

Structure Example 1

As shown in FIGS. 1 to 3, the first burying region 19 may include a second bulk semiconductor region 39 for blocking current. The first burying region 19 includes a first confining section 39b which extends along and on the first side 17b of the mesa waveguide 17. In the present example, the first confining section 39b reaches the side edge 3a of the quantum cascade semiconductor laser 1. In a similar manner, the second burying region 21 includes a second confining section 39c which extends along and on the second side 17c of the mesa waveguide 17. In the present example, the second confining section 39c reaches the side edge 3b of the quantum cascade semiconductor laser 1. The first confining section 39b and the second confining section 39c of the second bulk semiconductor region 39 include at least one of a semi-insulating semiconductor or an undoped semiconductor. These high resistive materials enable the second bulk semiconductor region 39 to favorably function as a current blocking layer for confining a current (carriers) to the mesa waveguide 17. In addition, the second bulk semiconductor region 39 has one portion provided on each of the sides of the mesa waveguide 17 and another portion provided on an area different from the sides of the mesa waveguide 17, and a high resistance of the second bulk semiconductor region 39 is capable of providing the other portion outside the mesa waveguide 17 with high resistivity, and is effective in reducing the leakage current that flows outside of the mesa waveguide 17.

More specifically, the second bulk semiconductor region 39 includes a semi-insulating semiconductor. The semi-insulating semiconductor can be doped with a transition metal. The transition metal can be at least one of Fe, Ti, Cr, or Co. In the quantum cascade semiconductor laser 1, the addition of the transition metal to III-V compound semiconductors allows semiconductors, such as InP, GaInAs, AlInAs, GaInAsP, and AlGaInAs, to have a semi-insulating property with sufficient high resistance to electrons, such as $10^5$ ($\Omega \cdot cm$) or higher. The doping of these transition metals is suitable for demonstrating a high resistance material of the bulk semiconductor region in the quantum cascade semiconductor laser 1.

Structure Example 2

Figure 5:
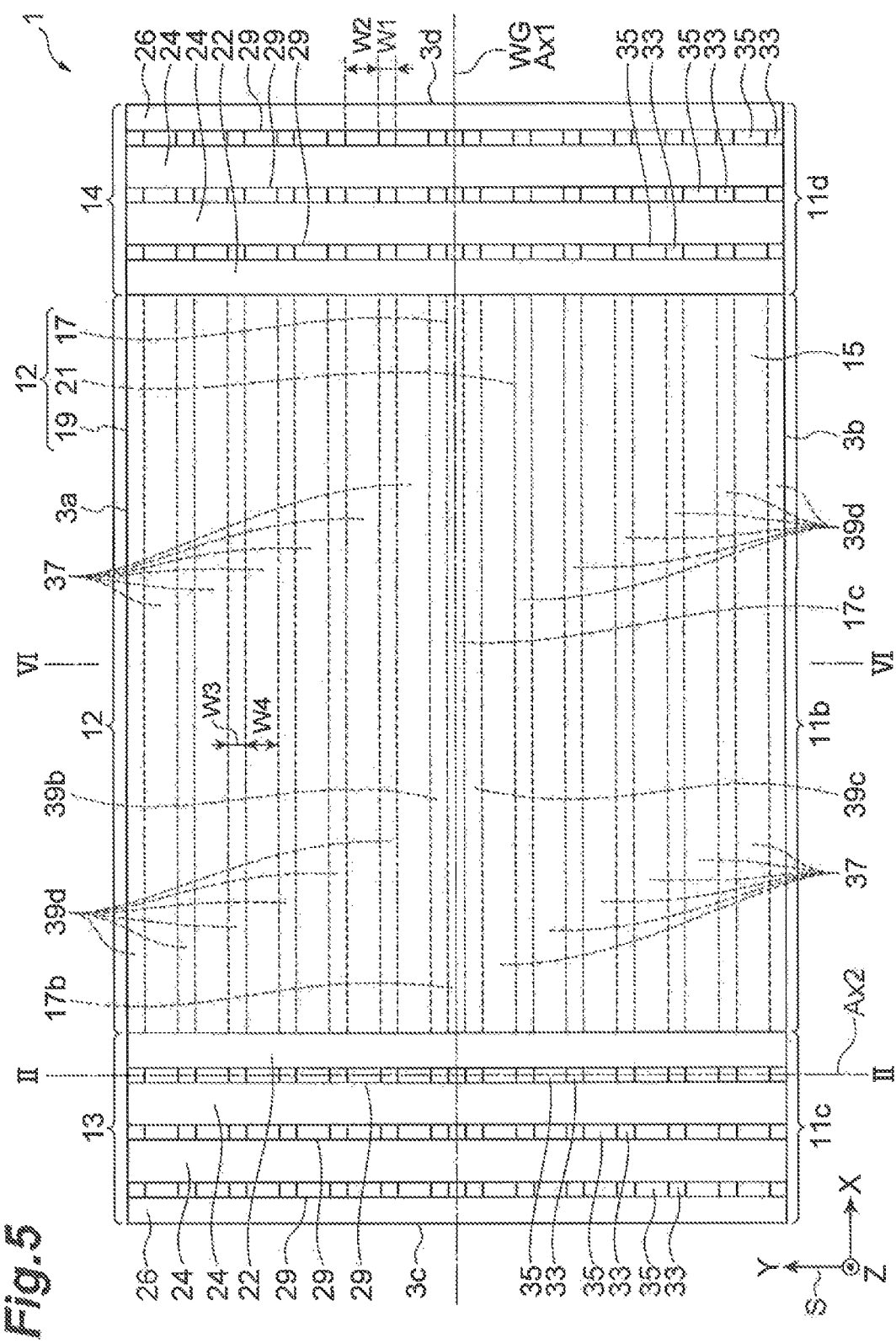
FIG. 5 is a plan view schematically showing a quantum cascade semiconductor laser according to an embodiment.
Figure 6:
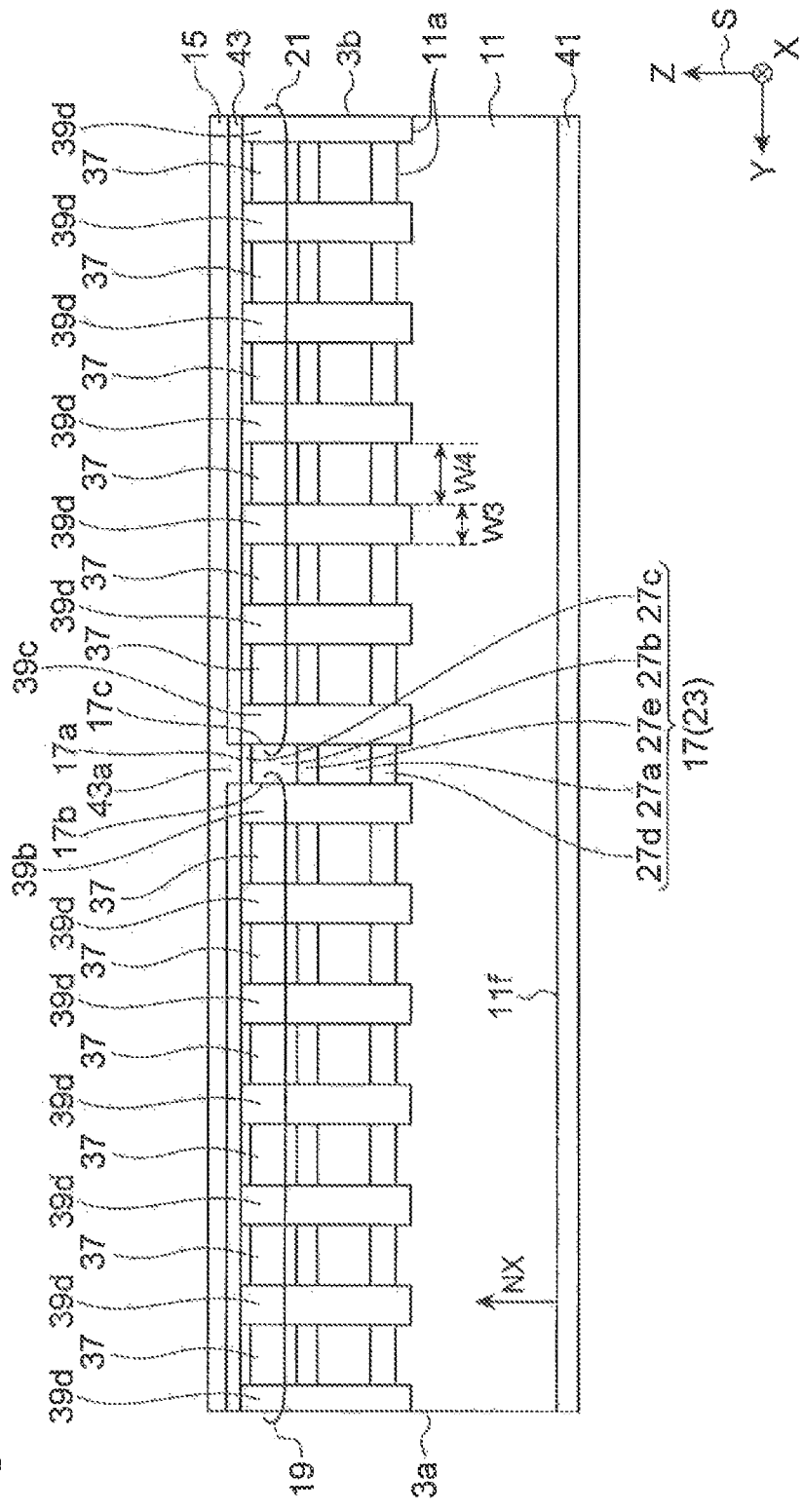
FIG. 6 is a schematic cross sectional view, taken along line VI-VI in FIG. 5, showing the quantum cascade semiconductor laser.

FIG. 5 is a plan view schematically showing a quantum cascade semiconductor laser according to an embodiment. FIG. 6 is a cross sectional view, taken along line VI-VI in FIG. 5, schematically showing the quantum cascade semiconductor laser. The cross section taken along line II-II in FIG. 5 is already shown in FIG. 2. Each of the first burying region 19 and the second burying region 21 includes second laminate regions 37, and a second bulk semiconductor region 39 that buries the second laminate regions 37. In the present example, the second bulk semiconductor region 39 is constituted in the first burying region 19 by both first bulk portions 39d and the first confining section 39b which extend in the direction of the first axis Ax1, and in the second burying region 21 by first bulk portions 39d and the second confining section 39c that extend in the direction of the first axis Ax1. In addition, the second laminate regions 37 extend in the direction of the first axis Ax1 and each have the stacked semiconductor layer 23. The first bulk portions of the second bulk semiconductor region 39 and the second laminate regions 37 are alternately arrayed in the direction of the second axis Ax2.

Specifically, as shown in FIG. 5, the second bulk semiconductor region 39 can include first bulk portions 39d provided in the first burying region 19. In the first burying region 19, the first bulk portions 39d and the second laminate regions 37 are alternately arrayed in a direction from the mesa waveguide 17 to the side edge 3a of the quantum cascade semiconductor laser 1. Specifically, the first confining section 39b extends along the first side 17b of the mesa waveguide 17, the second laminate region 37 extends along the first confining section 39b, and the first bulk portions 39d extend along the respective second laminate regions 37. The first burying region 19 can further include first bulk portions 39d and second laminate regions 37, and accordingly, in the first burying region 19, the first bulk portions 39d and the second laminate regions 37 are alternately arrayed in a direction of the second axis Ax2. The arrangement of the first bulk portions 39d and the second laminate regions 37 is across an entire area provided from the mesa waveguide 17 to the side edge 3a. In the present example, one of the first bulk portions 39d appears on the side edge 3a. The first burying region 19 includes the first bulk portions 39d and the first confining section 39b, which are separated from each other by the second laminate regions 37. The insulating layer 43 is provided between the second laminate regions 37 and the upper electrode 15 to prevent the upper electrode 15 from being connected to the second laminate regions 37. The second burying region 21 also includes the first bulk portions 39d and the second confining section 39c, which are separated from each other by the second laminate regions 37. With the exception of the first confining section 39b being replaced with the second confining section 39c, the second burying region 21 has a substantially same structure as the first burying region 19 and, in the second burying region 21, the second bulk semiconductor region 39 can include the first bulk portions 39d arrayed in a similar manner to the first burying region 19. In the first burying region 19 and the second burying region 21, the first confining section 39b, the second confining section 39c, and the first bulk portions 39d extend in the direction of the first axis Ax1 and are separated from each other by the mesa waveguide 17 or the second laminate regions 37.

In the quantum cascade semiconductor laser 1, each of the first burying region 19 and the second burying region 21 includes the second bulk semiconductor region 39 and the second laminate regions 37, and the mesa waveguide 17 and the second laminate regions 37 each have the stacked semiconductor layer 23. In addition, the second laminate regions 37 and the first bulk portions 39d of the second bulk semiconductor region 39 are alternately arrayed in the direction of the second axis Ax2, the second laminate regions 37 extend in the direction of the first axis Ax1, and the second bulk semiconductor region 39 is grown so as to bury the second laminate regions 37. A semiconductor region for the first burying region 19 and the second burying region 21 is formed by growing the second bulk semiconductor region 39 between the second laminate regions 37 so as to bury the second laminate regions 37, and this selective growth allows the semiconductor region thus grown to have a favorable uniformity in height, defined as a dimension in the direction of the normal axis NX, along the direction of the second axis Ax2. This structure can provide the top surface of the laser region 12 with a favorable flatness.

As described above, the alternating array of the second bulk semiconductor region 39 and the second laminate regions 37 provides the top surface of the laser region 12 with a favorable flatness. The flatness results in that the quantum cascade semiconductor laser 1 can be readily mounted in an epi-down manner. The epi-down mounting can provide the quantum cascade semiconductor laser 1 with a superior heat dissipation. The quantum cascade semiconductor laser implemented by the epi-down mounting can avoid deterioration of lasing performance caused by heat dissipation failure.

The second laminate regions 37 in the first burying region 19 and the second burying region 21 are formed in the same etching process together with the mesa waveguide 17. The application of the arrayed second laminate regions 37 to the first and second burying regions 19, 21 allows the etching of parts, which the second bulk semiconductor region 39 is to be grown, of the semiconductor region thereby forming the second laminate regions 37 in the above etching process. The arrayed structure makes it possible to reduce the area of semiconductor that is to be removed by the etching, as compared to a structure in which an entire semiconductor laminate 23 in areas where corresponding first and the second burying regions 19, 21 are to be formed is etched. Such a reduction in the area to be etched can increase the etching rate, thereby more readily forming the high mesa waveguide 17 that is desired for the quantum cascade semiconductor laser 1.

Structure Example 3

Figure 7:
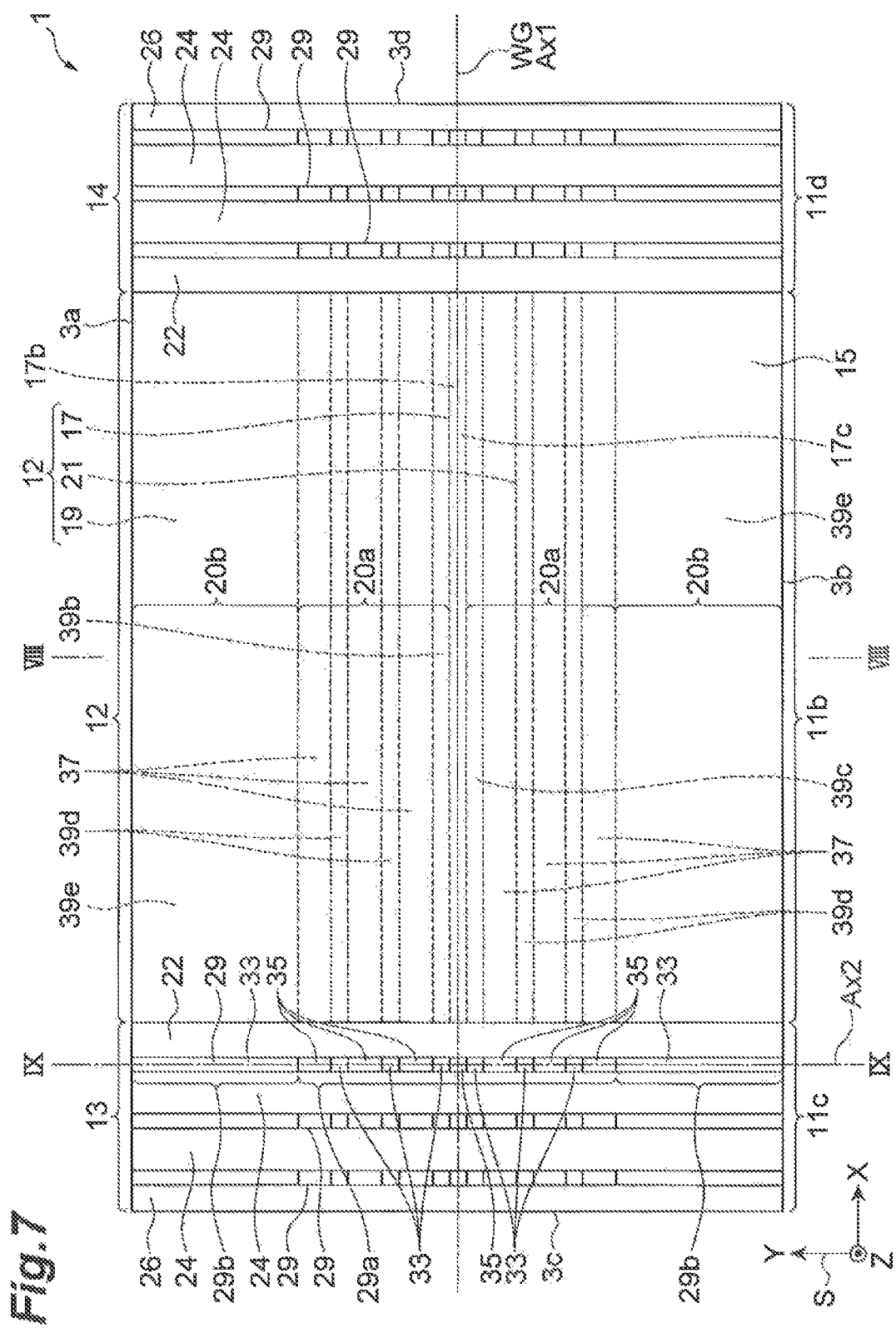
FIG. 7 is a plan view schematically showing a quantum cascade semiconductor laser according to an embodiment.
Figure 8:
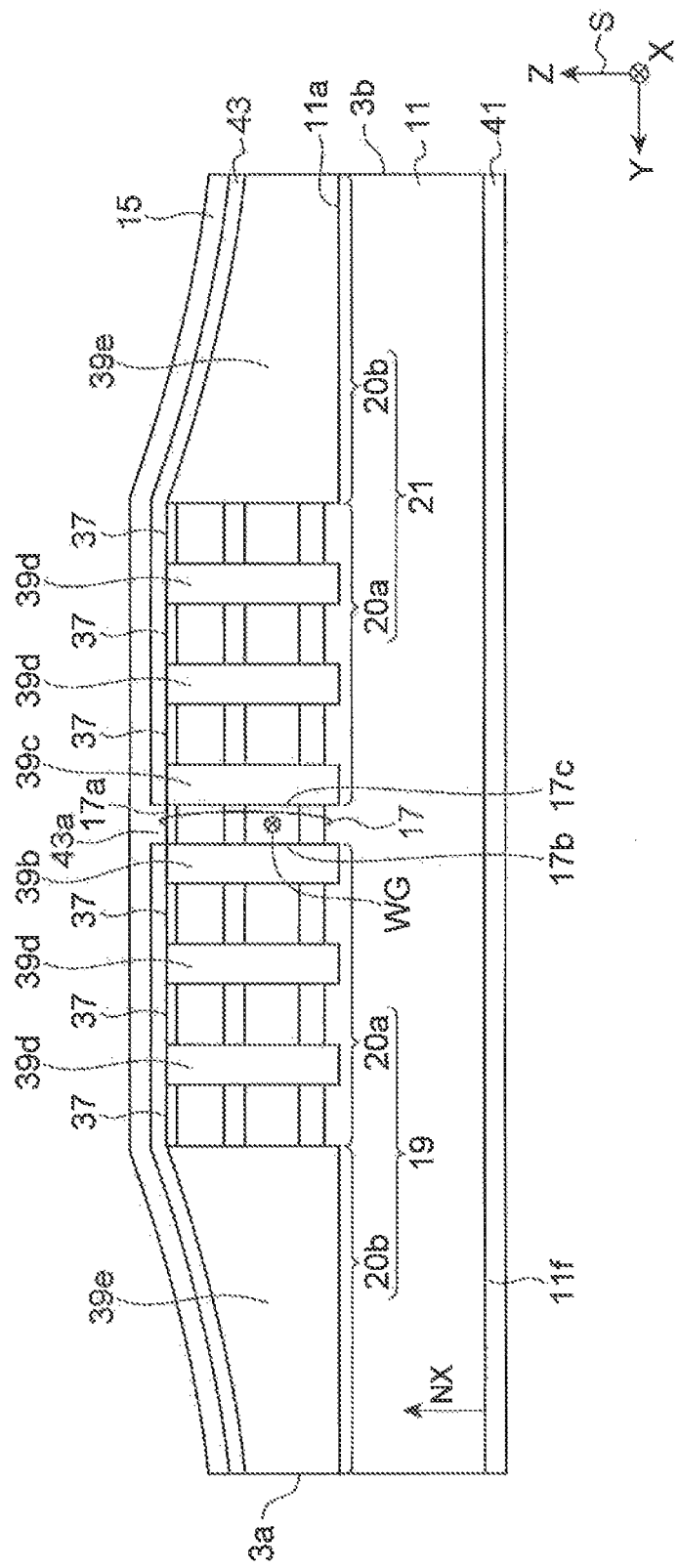
FIG. 8 is a schematic cross sectional view, taken along line VIII-VIII in FIG. 7, showing the quantum cascade semiconductor laser.
Figure 9:
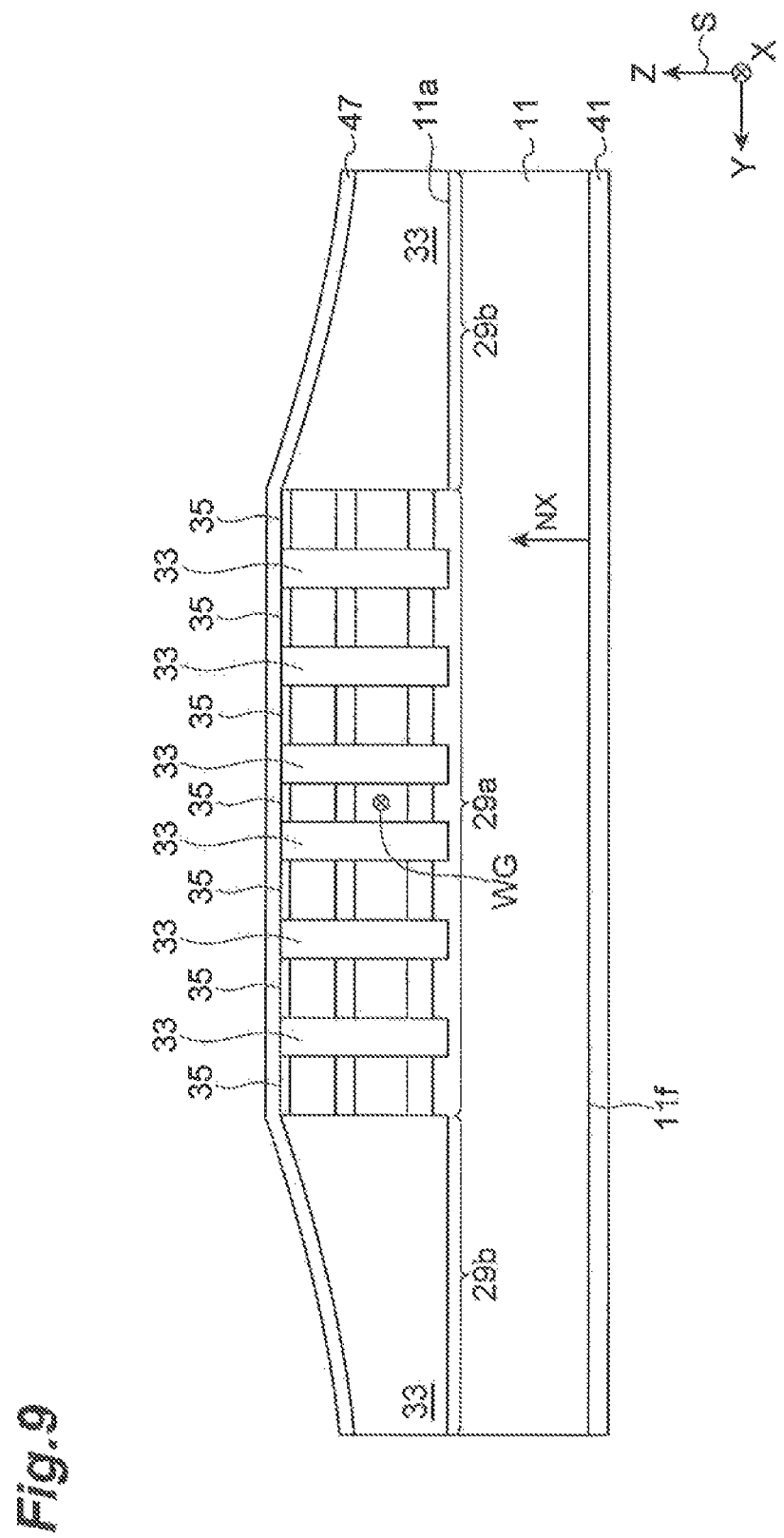
FIG. 9 is a schematic cross sectional view, taken along line IX-IX in FIG. 7, showing the quantum cascade semiconductor laser.

FIG. 7 is a schematic plan view showing a quantum cascade semiconductor laser according to an embodiment. FIG. 8 is a schematic cross sectional view, taken along line VIII-VIII in FIG. 7, showing the quantum cascade semiconductor laser. FIG. 9 is a schematic cross sectional view, taken along line IX-IX in FIG. 7, showing the quantum cascade semiconductor laser.

Each of the first burying region 19 and the second burying region 21 includes a first burying portion 20a and a second burying portion 20b. The first burying portion 20a and the second burying portion 20b are arranged in order in a direction from the waveguide axis WG, which is parallel to the first axis Ax1, to the side edge 3a (3b) of the quantum cascade semiconductor laser 1. The first burying portion 20a includes the second laminate regions 37, the first confining section 39b, the second confining section 39c, and the first bulk portions 39d (the second bulk semiconductor region 39), and the second laminate regions 37 and the first bulk portions 39d are alternately arrayed in the direction of the second axis Ax2. As seen from the above, the first burying portion 20a has an array structure similar to the first burying region 19 and the second burying region 21 according to structure example 2.

The second burying portion 20b does not include the second laminate regions 37, but includes a region 39e of the second bulk semiconductor region 39. The second bulk semiconductor region 39e of the second burying portion 20b extends in the direction of the first axis Ax1 from one boundary between the waveguide area 11b and the distributed Bragg reflection area 11c to another boundary between the waveguide area 11b and the distributed Bragg reflection area 11d. The second bulk semiconductor region 39e of the second burying portion 20b also extends in the direction of the second axis Ax2 from a boundary between the first burying portion 20a and the second burying portion 20b to the side edge 3a (3b) of the quantum cascade semiconductor laser 1.

In the quantum cascade semiconductor laser 1, each of the first burying region 19 and the second burying region 21 includes the first burying portion 20a positioned near the waveguide axis WG, and the second burying portion 20b positioned on the outside of the first burying portion 20a apart from the waveguide axis WG. The second burying portion 20b includes the second bulk semiconductor region 39e, and the second bulk semiconductor region 39e extends in the directions of the first axis Ax1 and the second axis Ax2. The array structure of the first burying portion 20a allows the surface of a region constituted by the mesa waveguide 17 and the first burying portion 20a to have a favorable flatness in a similar manner to the structure in example 2. In addition, the second burying portion 20b is made of a high-resistance bulk semiconductor of a single material. The application of a bulk semiconductor with high resistance to the second burying portion 20b can increase a proportion of the bulk semiconductor region of high resistivity to the total of the first burying region 19 and the second burying region 21, as compared to the structure in example 2. This structure can provide the first and second burying regions 19 and 21 with a higher resistivity and a reduced leakage current flowing through the first and second burying regions 19, 21, as compared to the structure in example 2. Accordingly, characteristics of the quantum cascade semiconductor laser can be further improved.

In the structure in example 3, the semiconductor walls 29 each include a first portion 29a and a second portion 29b. The first portion 29a and the second portion 29b are arranged in order in a direction from the waveguide axis WG to the side edge 3a (3b) of the quantum cascade semiconductor laser 1. The first portion 29a of each semiconductor wall 29 is provided in alignment with the position of the first burying portion 20a on the waveguide area 11b, and the second portion 29b of each semiconductor wall 29 is provided in alignment with the position of the second burying portion 20b on the waveguide area 11b. The first laminate regions 35 and the first bulk semiconductor region 33 are alternately arrayed in the direction of the second axis Ax2 is the entire first portion 29a of each semiconductor wall 29. The first bulk semiconductor region 33 extends over the entire second portion 29b of the semiconductor wall 29 in the direction of the second axis Ax2 from the boundary between the first portion 29a and the second portion 29b to the side edge 3a (3b) of the quantum cascade semiconductor laser 1. In the present example, the first portion 29a of each semiconductor wall 29 includes the first laminate regions 35 and the first bulk semiconductor region 33, which are provided in alignment with the array structure in the first burying portion 20a. The second portion 29b of the semiconductor wall 29 does not include the first laminate regions 35 but is made of the first bulk semiconductor region 33, which is provided in alignment with the array structure of the second burying portion 20b.

In the quantum cascade semiconductor laser 1, each of the semiconductor walls 29 includes the first portion 29a which is positioned near the waveguide axis WG, and the second portion 29b, which is apart from the waveguide axis WG, positioned on the outside of the first portion 29a. The second portion 29b includes the first bulk semiconductor region 33, and the first bulk semiconductor region 33 extends in the direction of the second axis Ax2. The second portion 29b does not include the first laminate regions 35 and is made of a bulk semiconductor made of a single material. The application of a bulk semiconductor to the second portion 29b can reinforce the mechanical strength of the second portion 29b in the semiconductor walls to make the semiconductor walls 29 for distributed Bragg reflection less susceptible to damage, as compared to the structures in examples 1 and 2. If necessary, as shown in FIG. 9, the semiconductor walls 29 may contain the first semiconductor capping layer 47 in an uppermost portion thereof in a similar manner to the structure in example 1 shown in FIG. 2. The addition of the first semiconductor capping layer 47 can increase the strength of the semiconductor walls 29, thereby making the semiconductor walls 29 even less susceptible to damage.

In the structures in examples 1, 2, and 3, it is preferable that the second bulk semiconductor regions 39 (39b, 39c, 39d, and 39e) include an undoped or semi-insulating semiconductor of high resistance. In the quantum cascade semiconductor laser 1, the second bulk semiconductor region 39 provides the first confining section 39b and the second confining section 39c, each including the above high-resistive material, which are in contact with the first side surface 17b and the second side 17c of the mesa waveguide 17, respectively. The first confining section 39b and the second confining section 39c act as current blocking layers for constricting a current to the mesa waveguide 17. In addition, in the structure in which the first burying region 19 and the second burying region 21 each include a portion of the above-described high-resistive material apart from the mesa waveguide 17, the second bulk semiconductor region 39 with such a high resistivity can make an electrical resistance in the first burying region 19 and the second burying region 21 high. This high electrical resistance can reduce a leakage current that flows through the first burying region 19 and the second burying region 21 which bury the mesa waveguide 17.

Moreover, the second bulk semiconductor regions 39 in the first burying portion 20a and the second burying portion 20b need not necessarily be made of the same bulk semiconductor material, and, if needed, may be made of different bulk semiconductor materials. In a similar manner, the first bulk semiconductor regions 33 of the first portion 29a and the second portion 29b need not necessarily be made of the same bulk semiconductor material, and, if needed, may be made of different bulk semiconductor materials.

Structure Example 4

Figure 10:
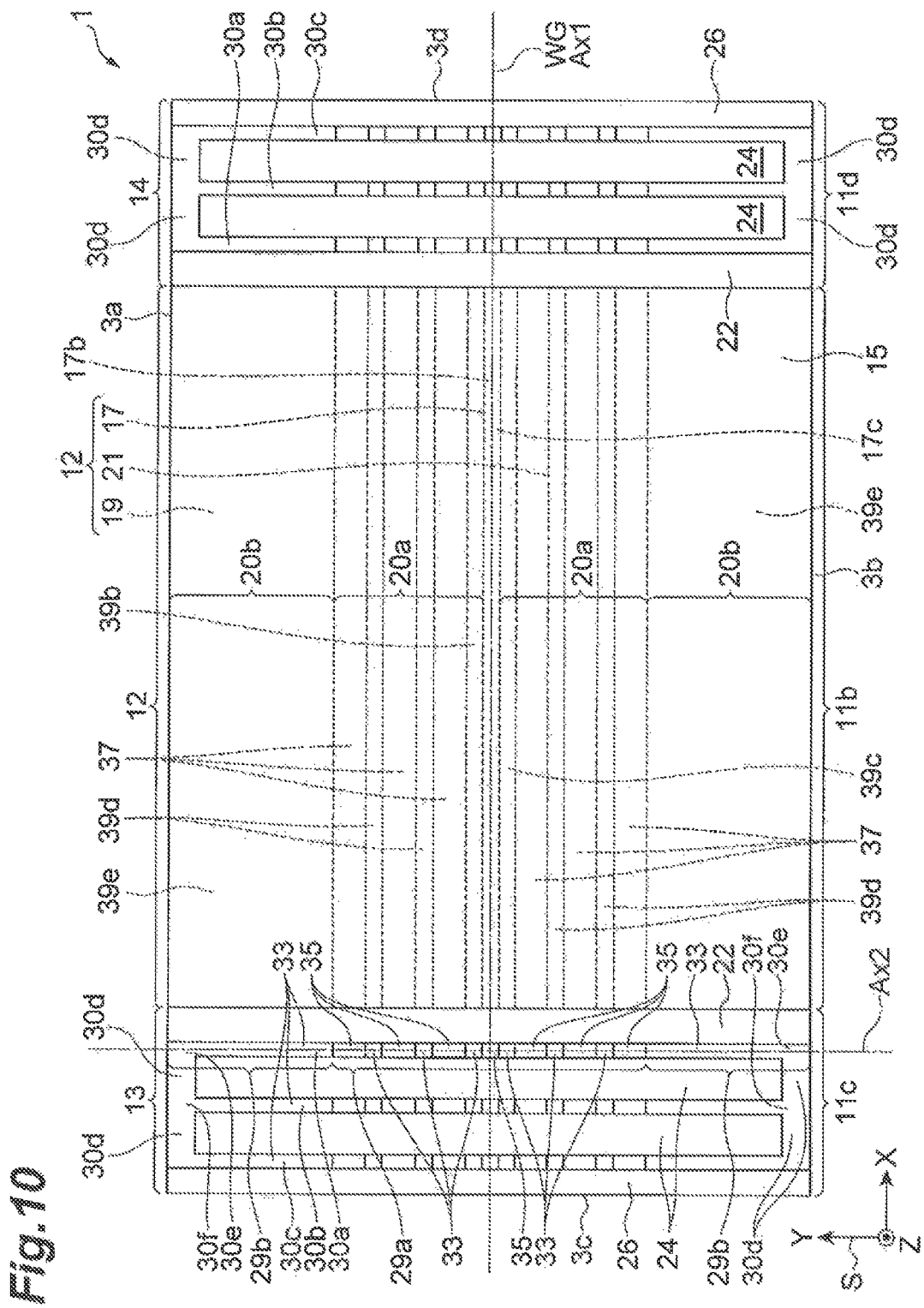
FIG. 10 is a plan view schematically showing a quantum cascade semiconductor laser according to the present embodiment.

FIG. 10 is a schematic plan view showing a quantum cascade semiconductor laser according to the present embodiment. A structure in the present example is the same as structure example 3 with the exception of the addition of one or more first reinforcing sections 30d. In a similar manner to the structure in example 3, each of the semiconductor walls 29 of the distributed Bragg reflection region 13 (14) includes a first wall 30a, a second wall 30b, and a third wall 30c, each of which is made up of the first portion 29a and the second portion 29b. The distributed Bragg reflection region 13 (14) can further include the first reinforcing sections 30d which connect the first wall 30a, the second wall 30b, and the third wall 30c with each other. The first reinforcing sections 30d extends in the direction of the first axis Ax1 and, in the present example, connect the adjacent two walls among the first wall 30a, the second wall 30b, and the third wall 30c in the second portion 29b. In the quantum cascade semiconductor laser 1, the semiconductor walls 29 are connected to each other via the corresponding first reinforcing section 30d so as to integrate the first reinforcing sections 30d and the semiconductor walls 29 with each other. This reinforcement structure can further increase the mechanical strength of the distributed Bragg reflection region 13 (14), as compared to the structure, which does not have any reinforcement structure, as in example 3. As a result, the distributed Bragg reflection region 13 (14) becomes less susceptible to damage, and manufacturing yield and durability of the device can be further improved.

In the structure in example 4, with the connection between the first wall 30a and the second wall 30b, the first wall 30a includes an 11-th portion 30e, connected to the first reinforcing section 30d, in the second portion 29b, and the second wall 30b includes a 21-th portion 30f, connected to the first reinforcing section 30d, in the second portion 29b. In the embodiment, the 11-th portion 30e is a third portion of the first wall. The 21-th portion 30f is a fourth portion of the second wall. It is preferable that these connecting sections be made of the same semiconductor material as the first reinforcing section 30d. The first reinforcing section 30d, the 11-th portion 30e, and the 21-th portion 30f which are made of the same material are crystallographically integrated with each other to constitute a structure made of a single material. This structure can increase the strength of the distributed Bragg reflection region 13 (14) more effectively. In addition, the first reinforcing section 30d, the 11-th portion 30e, and the 21-th portion 30f which are made of the same material allow the first reinforcing section 30d, the 11-th portion 30e, and the 21-th portion 30f to be formed together. This process to form the first reinforcing section 30d, the 11-th portion 30e, and the 21-th portion 30f together can simplify the manufacturing process of the quantum cascade semiconductor laser 1. In the above description, the first reinforcing section 30d is applied to structure example 3, but the application of the first reinforcing section 30d is not limited to the present example, and the first reinforcing section 30d can be similarly applied to the structures of the other examples.

Structure Example 5

Figure 11:
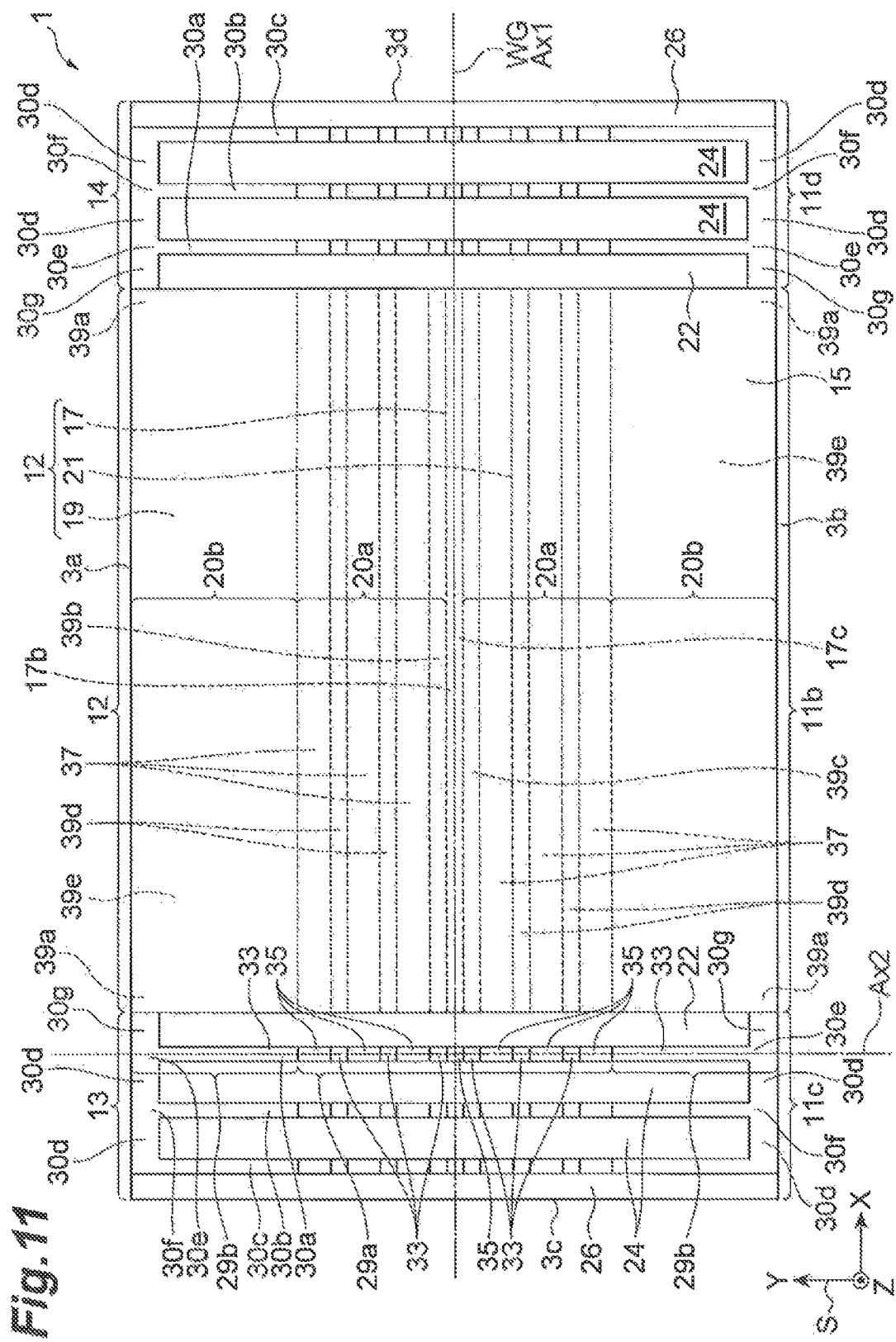
FIG. 11 is a plan view schematically showing a quantum cascade semiconductor laser according to the present embodiment.

FIG. 11 is a schematic plan view showing a quantum cascade semiconductor laser according to the present embodiment. In the present example, the distributed Bragg reflection region 13 (14) further includes a second reinforcing section(s) 30g, added to the structure in example 4, which connects the semiconductor wall 29 to the first burying region 19 and/or the second burying region 21, and the structure in example 5 is the same structure as structure example 4 except for the addition of the second reinforcing section 30g. The second portions 29b of the semiconductor wall 29 (30a) in the distributed Bragg reflection region 13 (14) are connected via the respective second reinforcing sections 30g to the second burying portions 20b of the first burying region 19 and the second burying region 21 in the laser region 12 to form an integrated structure of the second portions 29b and the second burying portions 20b. This structure can increase the mechanical strength of the distributed Bragg reflection region 13 (14), thereby avoiding damage to the distributed Bragg reflection region 13 (14). The second reinforcing section 30g enables production yield and durability of the device to be improved. In the present example, the quantum cascade semiconductor laser 1 further includes the first reinforcing section 30d.

In order to implement the second reinforcing section 30g, the semiconductor wall 29 (30a) includes a connecting section (for example, the 11-th portion 30e), connected to the second reinforcing section 30g, of the second portion 29b. It is preferable that the connecting section be made of the same material as the material of the second reinforcing section 30g. In the quantum cascade semiconductor laser 1, the connecting section (for example, the 11-th portion 30e) of the semiconductor wall 29 (30a) and the second reinforcing section 30g are made of the same material to be crystallographically integrated with each other to constitute a structure made of a single material. This structure can increase the strength of the distributed Bragg reflection region 13 (14) more effectively. In addition, the connecting section of the semiconductor wall 29 (30a) and the second reinforcing section 30g that are made of the same material can be formed together. This formation can simplify the manufacturing process of the quantum cascade semiconductor laser.

In the structure in example 5, the first burying region 19 includes a connection burying section 39a which is connected to the second reinforcing section 30g, and the second burying region 21 similarly includes the connection burying section 39a which is connected to the second reinforcing section 30g. In the embodiment, the connection burying section 39a serves as a third burying portion of the first burying region or a fourth burying portion of the second burying region. It is preferable that the second reinforcing section 30g and the connected burying section 39a of the first burying region 19 (the second burying region 21) be made of the same material. The second reinforcing section 30g and the connected burying section 39a of the first burying region 19 (the second burying region 21) are made of the same material to be crystallographically integrated with each other to constitute a structure made of a single material. This structure can increase the strength of the distributed Bragg reflection region 13 (14) effectively. The second reinforcing section 30g and the connected burying section 39a of the first burying region 19 (the second burying region 21) made of the same material allows the second reinforcing section 30g and the connected burying section 39a to be formed together. This formation can simplify the manufacturing process of the quantum cascade semiconductor laser 1. The structure including both the second reinforcing section 30g and the first reinforcing section 30d has been described above, but the present embodiment is not limited to the above-described structures. Another structure including the second reinforcing section 30g without the first reinforcing section 30d can be applied to the present embodiment. In addition, the second reinforcing section 30g can be similarly applied to structures of other examples besides the structure in example 4.

Structure Example 6

Figure 12:
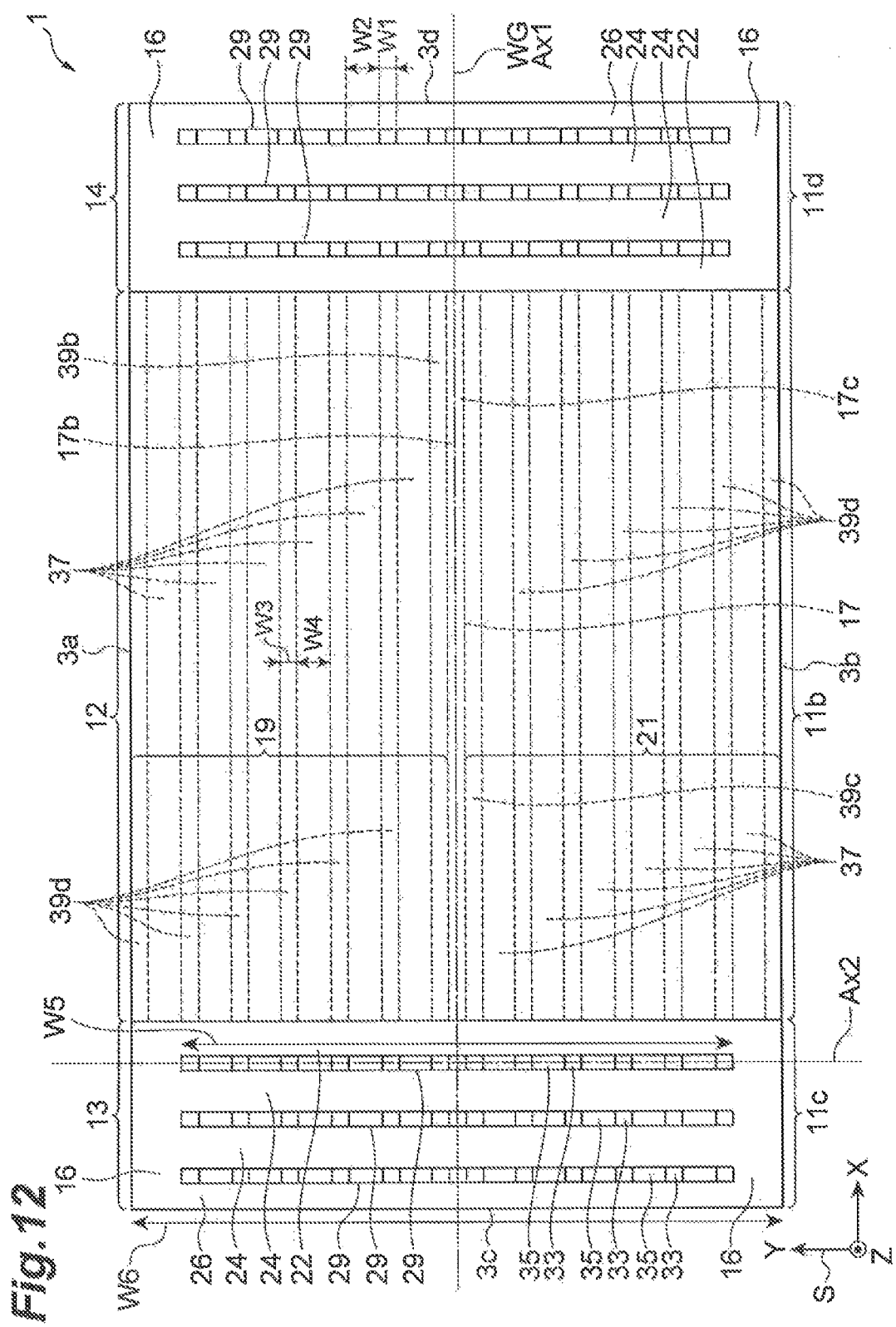
FIG. 12 is a plan view schematically showing a quantum cascade semiconductor laser according to the present embodiment.

FIG. 12 is a schematic plan view showing a quantum cascade semiconductor laser according to the present embodiment. In the present example, a wall width W5 of the semiconductor walls 29 in the direction of the second axis Ax2 in the distributed Bragg reflection region 13 (14) is set shorter than a device width W6 of the substrate 11 for the quantum cascade semiconductor laser in the structure in example 2. The structure according to the present example is the substantially same as the structure example 2 except for the above widths. In the distributed Bragg reflection area 11c (11d), one end and the other end of the semiconductor wall 29 arranged in the direction of the second axis Ax2 are separated from the side edges 3a and 3b of the quantum cascade semiconductor laser 1, respectively, and a vacant section 16 is formed along each of the side edges 3a and 3b. The vacant section 16 is a void in which the main surface 11a is exposed in a similar manner to the gap 24 (22 and 26) and connects with the gaps 24 (22 and 26). In the quantum cascade semiconductor laser 1, the structure in which the wall width W5 of the semiconductor walls 29 is shorter than the device width W6 corresponding to one device size on the wafer makes in-plane uniformity and reproducibility better in etching for forming the semiconductor walls 29 for distributed Bragg reflection in the fabrication of the quantum cascade semiconductor laser 1, and can avoid decrease in production yield resulting from damage which may occur in the semiconductor walls 29 during a process to form devices by separation, and can reinforce the mechanical strength of the semiconductor wall 29 to make the semiconductor wall 29 less susceptible to damage.

Next, examples will be described.

First Example

In a quantum cascade semiconductor laser according to the structure in example 1 (FIGS. 1 to 3), both sides of a mesa waveguide 17 are buried by high resistive undoped or semi-insulating bulk semiconductors 39b and 39c. In the device with this buried (BH) structure, the mesa waveguide 17 has a laminate structure 23 including epitaxial layers, such as an n-type lower clad layer 27d, a core (light-emitting) layer 27a, a diffraction grating layer 27e, an n-type upper clad layer 27b, and an n-type contact layer 27c, which are laminated on an n-type substrate 11, and the mesa waveguide 17 extends in the direction of a waveguide axis WG. An upper electrode 15 is provided on a device surface, and a lower electrode 41 is provided on a back surface 11f of the substrate. An insulating film 43 is provided between the upper electrode 15 and the current blocking layers 39b and 39c, which burying regions 19 and 21 contain, respectively. Meanwhile, in high refractive index portions 29 of distributed Bragg reflection regions 13 and 14, first bulk semiconductor regions 33 and the first laminate regions 35 are alternately arrayed along the main surface 11a of the substrate from one end 3a to the other end 3b of the device in a direction intersecting the waveguide axis WG (Ax2-axial direction). Regarding the first bulk semiconductor regions 33 and the first laminate regions 35, each of the first laminate regions 35 has the same semiconductor laminate structure 23 as the mesa waveguide 17, and the first bulk semiconductor region 33 is made of a bulk semiconductor. For example, the first bulk semiconductor regions 33 are made of the same highly resistive semiconductor as the current blocking layers 39b and 39c. In addition, each of the distributed Bragg reflection regions 13 and 14 has low refractive index portions 22, 24, and 26 each of which is constituted by a gap or a void which the semiconductor layer 23 on the substrate is removed so as to form.

Materials constituting the respective regions will now be described.

The substrate 11 includes, for example, an n-type InP substrate. Semiconductor layers constituting a mid-infrared quantum cascade semiconductor laser are formed of semiconductor materials with respective lattice constants which are close to that of InP, and using InP substrates allows favorable crystals to grow for the semiconductor layers. Further, an InP substrate is transparent to mid-infrared lasing light, and the InP substrate should act as a lower cladding layer. Another requirement that the substrate should meet is to have an electrical conductivity in order to energize the device therethrough. Since a quantum cascade semiconductor laser uses unipolar carrier and the carrier indicates generally electrons, an n-type substrate is used in terms of conduction type.

The upper cladding layer 27b and the lower cladding layer 27d can be made of n-type InP. Since InP is transparent to mid-infrared lasing light, the upper and lower cladding layers can be made of InP. In addition, InP is a binary mixed crystal and a lattice thereof is matched to that of InP substrates. The InP substrate allows favorable crystal to be readily grown thereon. Furthermore, since InP has the highest thermal conductivity among semiconductor materials usable for a mid-infrared quantum cascade semiconductor laser, a cladding layer of InP ensures favorable dissipation of heat from a core region, and improves temperature characteristics of the quantum cascade semiconductor laser.

The core layer 27a will be described below. The core layer 27a is constituted by a structure in which several tens of unit structures, each made up of an active layer 28a and an injection layer 28b, are cascade-connected periodically. The active layer 28a and the injection layer 28b both have thin-film quantum well layers with a thickness of several nanometers and thin-film barrier layers with a thickness of several nanometers but with a higher bandgap than the quantum well layer. The quantum well layers and the barrier layers are alternately laminated to constitute a superlattice structure. The core layer 27a has a superlattice structure made up of, as a whole, several hundred semiconductor layers. A quantum cascade semiconductor laser uses a unipolar carrier, e.g., electron, to generate light, which the electron transition between an upper level and a lower level of sub-bands in the conduction band generates. By appropriately adjusting an energy difference between the upper and lower levels constituted by material compositions and film thickness values of the quantum well layer and the barrier layer in the active layers 28a, the core layer can generate light in a mid-infrared wavelength range of 3 to 20 micrometers.

Materials suitable for generating mid-infrared light are as follows: for both the active layer 28a and the injection layer 28b, for example, GaInAs may be applied to the quantum well layer; and, for example, AlInAs may be applied to the barrier layer. A superlattice structure that constitutes a core region may include semiconductor layers made of the above materials. Light emission and electron transition take place repetitively in each of unit structures that are cascade-connected in the superlattice structure, and the repetitive emission in the unit structures is added up to release the light to the outside. Light emission intensifies with increase in current, and at the current exceeding a lasing threshold current, the lasing occurs so that the quantum cascade semiconductor laser emits a laser beam.

A quantum cascade semiconductor laser uses a conduction band alone, and electron transition between sub-bands in the conduction band generates light. Meanwhile, a semiconductor laser for optical communications uses a p-n junction, and an electron in a conduction band makes an inter-band transition to a valence band, so that the electron is recombined with a hole in the valence band, and the energy corresponding to the transition is released to emit light. The quantum cascade semiconductor laser differs from the semiconductor laser for optical communications in terms of light-emitting mechanisms.

The diffraction grating layer 27e will be described below. The laser of this type works as a DFB quantum cascade semiconductor laser, as shown in FIG. 4, and includes the diffraction grating layer 27e for wavelength selection extending in a direction of the waveguide axis WG (X direction). In the device, the diffraction grating has a structure with recesses and protrusions which are alternately arrayed at a period $\Lambda$, and the diffraction grating selectively reflects light of a Bragg wavelength corresponding to the appropriately-adjusted value of $\Lambda$, so that the optical amplification is caused in the optical cavity to create a single mode oscillation at that wavelength. The performance of the diffraction grating is represented in terms of a coupling coefficient that indicates a magnitude of coupling between forwardly propagating light and backwardly propagating light in the optical cavity. The diffraction grating that produces a large coupling coefficient is desirable for providing a distributed feedback (DFB) quantum cascade semiconductor laser with favorable single mode oscillation. Accordingly, it is preferable that the diffraction grating layer 27e be made of a material, for example, a semiconductor with a high refractive index which is effective in developing a large coupling coefficient, such as, undoped GaInAs or n-type GaInAs.

The contact layer 27c will be described below. In order to form favorable ohmic contact with the upper electrode 15, the contact layer 27c is desirably made of a material, which is capable of lattice matching with an InP substrate, with a low bandgap, and for example, n-type GaInAs desirably. In addition, the upper electrode 15 and the lower electrode 41 can be made of, for example, a Ti/Au or Ge/Au electrode.

If necessary, quantum cascade semiconductor laser may include light confining regions for enhancing confinement of propagating light to the core region, and the core region is sandwiched by the respective light confining regions on the upper and lower sides thereof. In order to enhance confinement of the propagating light to the core region, the light confining regions are desirably made of a material, which is capable of lattice matching with an InP substrate, with a high refractive index, for example, undoped GaInAs or n-type GaInAs.

If the upper electrode 15 is provided with a desired ohmic contact without the contact layer 27c, the contact layer 27c may be omitted. In addition, the substrate 11 made of a material (such as, InP) transparent to lasing light can be used as a lower cladding region, and the lower clad layer 27d may be omitted.

A dopant, such as, Si, S, Sn and Se, can be used for forming an n-type semiconductor layer.

The current blocking layers 39b and 39c will be described below. The current blocking layers 39b and 39c may be made of an undoped semiconductor or a semi-insulating semiconductor. These semiconductors have a high resistivity to electron acting as carrier, and are suitable as materials for the current blocking layers 39b and 39c, so that the current blocking layers 39b and 39c to which the above semiconductors are applied can confine an electrical current (carriers) to the mesa waveguide region 17. Semi-insulating semiconductors applicable to the current blocking layers 39b and 39c includes, for example, InP and AlInAs. Adding a transition metal, such as Fe, Ti, Cr, and Co, to these semiconductors can form deep levels, which can trap electrons, in a forbidden band of the semiconductors, and provides the semiconductors with a semi-insulating property. In particular, iron (Fe) is generally used as such a dopant. By adding these transition metals to III-V compound semiconductors, such as InP and AlInAs, such III-V compound semiconductors have a semi-insulating property with sufficient high resistive characteristics to electrons, such as, $10^5$ (Ω·cm) or higher. The III-V compound semiconductors thus doped can be favorably used as materials for the current blocking layers 39b and 39c.

In an undoped semiconductor having sufficient high resistance characteristics, the material of the current blocking layers 39b and 39c includes the undoped semiconductor besides a semi-insulating semiconductor. Specific examples of undoped or semi-insulating III-V compound semiconductors include materials, which can be readily grown by molecular beam epitaxy method, or organic metal vapor phase growth method, capable of lattice matching with the InP substrate 11, such as semiconductors including InP, GaInAs, AlInAs, GaInAsP, and AlGaInAs.

Another advantage is that an undoped or semi-insulating semiconductor contain a very small amount of free carriers (in a quantum cascade semiconductor laser constituted by an n-type semiconductor, "free carriers" indicate free electrons) which act as optical absorption sources in the mid-infrared region, so that an amount of mid-infrared light absorbed by the free carriers is very small. The current blocking layers 39b and 39c made of the semiconductors described above can suppress optical absorption caused by the free carriers and can provide favorable lasing characteristics.

Furthermore, these undoped and semi-insulating semiconductors have high thermal conductivity, and the current blocking layers 39b and 39c of the above semiconductors improve heat dissipation of the device and enables the device to operate at high temperatures. In particular, InP has the highest thermal conductivity among semiconductor materials usable for a mid-infrared quantum cascade semiconductor laser device, and the use of InP can provide the device with high heat dissipation capability, and InP is a binary mixed crystal enabling favorable crystal growth on the InP substrate 11, which results in that InP is often used as the semiconductor of the current blocking layers 39b and 39c.

The current blocking layers 39b and 39c, however, may be made of other semiconductors, such as AlInAs. AlInAs has a higher bandgap than InP, and using AlInAs in the current blocking layers 39b and 39c enables the conduction band to have a larger energy discontinuity between the current blocking layers 39b and 39c and the respective layers in the mesa waveguide 17 that are in contact with the current blocking layers 39b and 39c, as compared to the device where InP is used in place of AlInAs. As a result, AlInAs makes an energy barrier (an energy barrier to electrons) at an interface between the mesa waveguide 17 and the current blocking layers 39b and 39c large. The large energy barrier in addition to the intrinsic high resistivity of the current blocking layers 39b and 39c can further suppress the leakage of electrons from the mesa waveguide region 17 into the current blocking layers 39b and 39c. The current blocking layers 39b and 39c are provided with a further enhanced resistivity to electrons, and can confine current to the mesa waveguide region 17 more strongly. Accordingly, the quantum cascade semiconductor laser 1 can be provided with more favorable lasing characteristics.

The first bulk semiconductor region 33 will be described below. The first bulk semiconductor region 33 can be made of the same undoped or semi-insulating semiconductor materials as the current blocking layers 39b and 39c. The undoped semiconductor and semi-insulating semiconductor exhibit a very small amount of free-carrier absorption to mid-infrared light, and the application of these semiconductors to the first bulk semiconductor region 33 can make absorption of propagating light small in the high refractive index portion 29 of the distributed Bragg reflection regions 13 and 14. The first laminate region 35 is constituted by the same semiconductor layers as the mesa waveguide 17.

If necessary, the insulating film 43 is provided between the upper electrode 15 and the current blocking layers 39b and 39c. This insulating film may include, for example, a dielectric film, such as $SiO_2$, SiON, SiN, alumina, BCB resin, and polyimide resin. These dielectric films have a superior durability and a superior insulating property which are useful as a protective film of the semiconductor device. In addition, these dielectric films can be formed using an apparatus for forming dielectric films that adopts a film forming method, such as sputtering, chemical vapor deposition, and spin coating, and can be readily introduced into a manufacturing process for the device. However, the present insulating film is optional, and the insulating film can be omitted where the current blocking layers 39b and 39c alone can reduce a leakage current flowing outside of the mesa waveguide 17 c sufficiently, and can provide the mesa waveguide 17 with favorable current constriction.

In the present embodiment, the high refractive index portions 29 of the distributed Bragg reflection regions 13 and 14 has a structure in which the first bulk semiconductor regions 33 and the first laminate regions 35 are alternately arrayed from one side edge 3a of the device to the other side edge 3b in the lateral (Ax2) direction.

Second Example

In the first embodiment, only the distributed Bragg reflection regions 13 and 14 are provided with a structure in which the first laminate regions 35 and the first bulk semiconductor regions 33 are alternately arrayed. As shown in FIG. 5, the laser region 12 also has the burying regions 19 and 21, burying the mesa waveguide 17, which are provided with an alternating array of laminate regions and bulk semiconductor regions. As shown in FIG. 5, the first burying region 19 and the second burying region 21 can include an alternating array of second laminate regions 37 and second bulk semiconductor regions 39.

In the present embodiment, the low refractive index portions 22, 24, and 26 of the distributed Bragg reflection regions 13 and 14 are constituted by gaps or voids in a similar manner to the first example. As shown in FIG. 6, in order to electrically insulate an underlying semiconductor layer (the first burying region 19 and the second burying region 21) from the upper electrode 15 and to constrict currents to the mesa waveguide 17 in a similar manner to the first example, a dielectric insulating film for acting as the insulating layer 43 is provided in areas of the laser region 12 except for the top of the mesa waveguide 17.

In the second example, the application of an alternating array of the first laminate regions 35 and the first bulk semiconductor regions 33 to the distributed Bragg reflection regions 13 and 14 can also improve the surface flatness of an area in which the high refractive index portions 29 is to be formed.

A method of fabricating the quantum cascade semiconductor laser 1 according to the second example will be described with reference to FIGS. 13A to 16B. FIGS. 13A to 16B show areas corresponding to the size of a single device. FIGS. 13A, 13B, 14A, and 14B show cross sectional views, taken along a line perpendicular to the waveguide axis WG of the mesa waveguide 17 and corresponding to the YZ plane, showing processes for fabricating the quantum cascade semiconductor laser 1 according to the second example, and FIGS. 15A, 15B, 16A, and 16B are plan views, corresponding to the XY plane, showing processes for fabricating the semiconductor laser 1 according to the second example. The following description will provide an exemplary fabrication method. In order to facilitate the understanding, reference symbols used in the description of the quantum cascade semiconductor laser 1 already given will be used in the following description of the fabrication method.

Figure 15A:
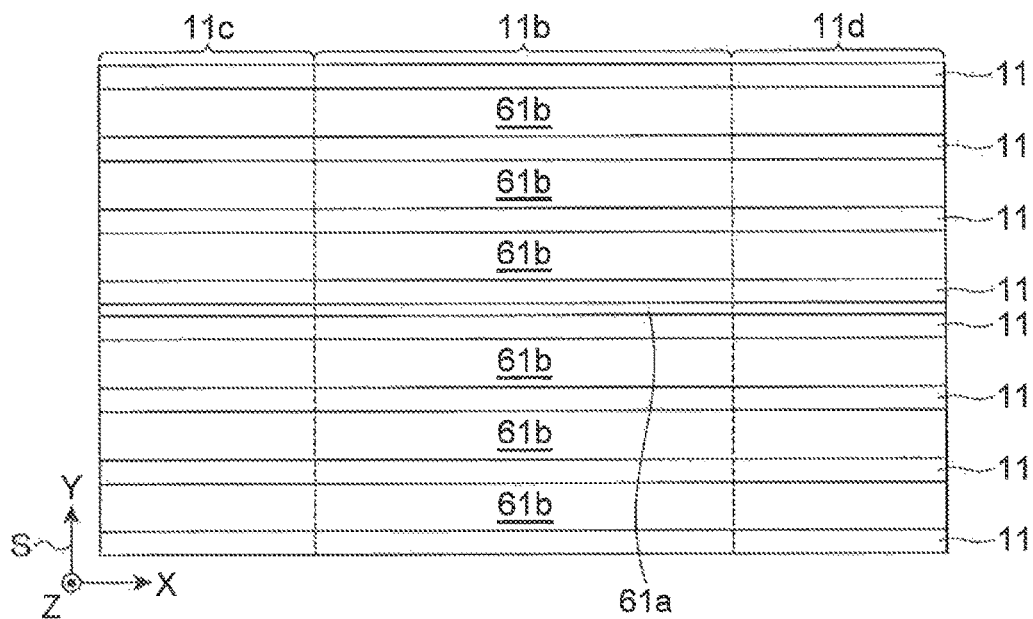
FIG. 15A is a schematic diagram showing a major process in the method according to the second example.
Figure 15B:
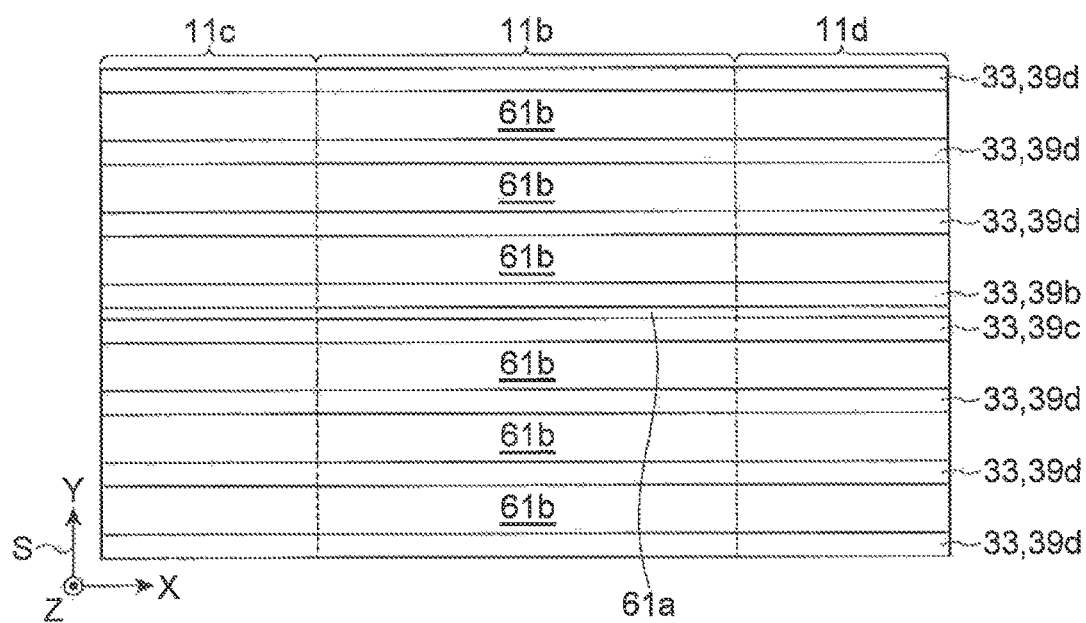
FIG. 15B is a schematic diagram showing a major process in the method according to the second example.

A diffraction grating, such as that shown in FIG. 4, is formed by the following processes: first growing the respective semiconductor layers including the lower cladding layer 27d, the core layer 27a, and the diffraction grating layer 27e on the substrate 11, such as a semiconductor wafer; subsequently patterning a resist film applied on the diffraction grating layer 27e with a period Λ in the direction of the waveguide axis WG (X direction) to form a mask pattern corresponding to projections of the diffraction grating in the diffraction grating layer 27e; and finally etching, with the mask, a part or all of the diffraction grating layer 27e corresponding to periodic depressions of the diffraction grating, which results in a diffraction grating shown in FIG. 4. In this process, photolithography or EB exposure can be used for the resist patterning, and wet etching or dry etching can be used for the etching. Subsequently, the upper cladding layer 27b and the contact layer 27c are grown on the diffraction grating in a second growth, so that semiconductor layers for the mesa waveguide 17 are provided across the entire substrate as shown in FIG. 13A. Next, as shown in FIG. 13B, a mask 61 is formed on the semiconductor layers, and the mask has a pattern 61a that defines the mesa waveguide 17 and a pattern 61b that defines the first laminate region 35 of the distributed Bragg reflection regions 13 and 14 and the second laminate region 37 of the laser region 12. The mask 61 is made of a dielectric film or the like. In the present example, the mask 61 has an opening of a size smaller than a pattern width. As shown in FIGS. 14A and 15A, the semiconductor layers in regions not covered with the mask is processed by dry etching with the mask 61 to form the stacked semiconductor layer 23 for the mesa waveguide 17 and the laminate regions (35 and 37) of the quantum cascade semiconductor laser 1. Voids defined by the first semiconductor laminate structures 23 are formed therebetween by the etching. Next, as shown in FIGS. 14B and 15B, the bulk semiconductor regions (33 and 39) are regrown to bury the laminate regions (35 and 37) with the top of the mesa waveguide 17 and the top of the laminate regions (35 and 37) being covered with the mask 61. In the regrowth, the growth area(s) where the bulk semiconductor regions (33 and 39) are to be regrown is composed of sections defined by the arrangement of the laminate regions (35 and 37) so as to form a structure allowing the growth rates of the bulk semiconductor regions (33 and 39) in the sectioned areas to become similar values. The sectioning allows the bulk semiconductors thus grown on the area(s) to have a similar thickness, so that the bulk semiconductor regions (33 and 39) can be formed with favorable flatness. After removing the mask 61, if necessary, a semiconductor layer for the first or second semiconductor capping layer 43 or 47 is grown thereon. Next, as shown in FIG. 16A, a mask 63 for forming the semiconductor walls 29 for distributed Bragg reflection in the distributed Bragg reflection areas 11c and 11d is formed. The mask 63 may be made of a dielectric film or the like. The mask 63 includes a pattern 63a that covers the laser region 12 on the waveguide area 11b, and a pattern 63b that defines the semiconductor walls 29 in the distributed Bragg reflection areas 11c and 11d. Selective etching is carried out with the mask 63 to remove semiconductor regions, which are not protected by the mask 63, thereby forming low refractive index portions of the distributed Bragg reflection regions, so that the distributed Bragg reflection regions (13 and 14) in the respective distributed Bragg reflection areas 11c and 11d are formed. The distributed Bragg reflection regions (13 and 14) include an array of the semiconductor walls 29. After removing the mask 63, as shown in FIG. 16B, the high refractive index portions 29 and low refractive index portions, such as the gaps 22, 24, and 26 are formed in the distributed Bragg reflection regions.

As understood from the manufacturing processes, the growth area where the first bulk semiconductor region 33 of the distributed Bragg reflection regions 13 and 14 is to be grown and the growth area where the second bulk semiconductor region 39 of the laser region 12 is to be grown have respective structures, similar to each other, in which the growth areas are patterned by the arrangement of the first laminate regions 35 and the second laminate regions 37 over both growth areas, so that growth rates in growing the first bulk semiconductor region 33 and the second bulk semiconductor region 39 on these growth areas are substantially independent of the locations on the growth areas to be similar values. The semiconductor layer for the first bulk semiconductor region 33 and the second bulk semiconductor region 39 is grown at a substantially uniform thickness over the entire device area.

Widths of the first bulk semiconductor region 33 in the distributed Bragg reflection regions 13 and 14 and the second bulk semiconductor region 39 in the laser region 12 (W1 in FIG. 2 and W3 in FIG. 6) are desirably a constant regardless of location. In this case, shapes of the first and second bulk semiconductor regions 33 and 39 thus grown become substantially same independent of location to improve uniformity of growth rates of bulk semiconductor in these regions, so that the semiconductor layer of the bulk semiconductor regions has high uniformity in thickness over the entire device.

While a fabrication method of the structure according to the second example has been described above, in order to fabricate the quantum cascade semiconductor laser according to the first example, a pattern of the mask 61 can be defined so that alternating arrays are not formed in the first burying region 19 and the second burying region 21.

FIG. 17 shows a cross sectional view, taken along a line on which a high refractive index portion of a distributed Bragg reflection region in a conventional BH structure quantum cascade semiconductor laser is located, showing the laser in a single device size. As seen from the reasons described above, a current blocking layer 8 that buries a mesa waveguide 10 gradually becomes thinner from the mesa waveguide 10 toward a device boundary 18 in a direction of a second axis Ax2. The current blocking layer 8 does not have a flat surface. Accordingly, in the exposure process to form a resist pattern by photolithography in order to form a dielectric mask for etching semiconductor walls for high refractive index portions, performing exposure by focusing on the top of the mesa waveguide 10 results in a focal deviation at a position far away from the mesa waveguide 10, whereas performing exposure by focusing on the top of the burying semiconductor near the device boundary 18 that is away from the mesa waveguide 10 also result in a focal deviation on or around the mesa waveguide 10. In this manner, a difference DH in height of the device surface causes a significant difference in focal states of an exposure beam in the direction of the second axis Ax2. The fabrication method shown in FIGS. 13A to 16B, however, makes the device surface flat in the distributed Bragg reflection regions 13 and 14, and causes no significant difference in focal states of an exposure beam that arises from a difference in height of the device surface as described above. Accordingly, the resist can be pattered in a single exposure condition, which is readily optimized, to improve patterning accuracy of the resist, compared to a conventional BH structure quantum cascade semiconductor laser. A resist mask with favorable pattern accuracy allows the dielectric mask 63b formed with the resist mask to have favorable pattern accuracy. Finally, as compared to a conventional BH structure quantum cascade semiconductor laser, the fabrication with the above dielectric mask significantly improves processing accuracy of the high refractive index portions 29, in particular, processing accuracy of the thickness WH of the semiconductor walls, defined in the direction of the first axis Ax1, which is one of factors in determining reflectivity of the distributed Bragg reflection regions.

Figure 18:
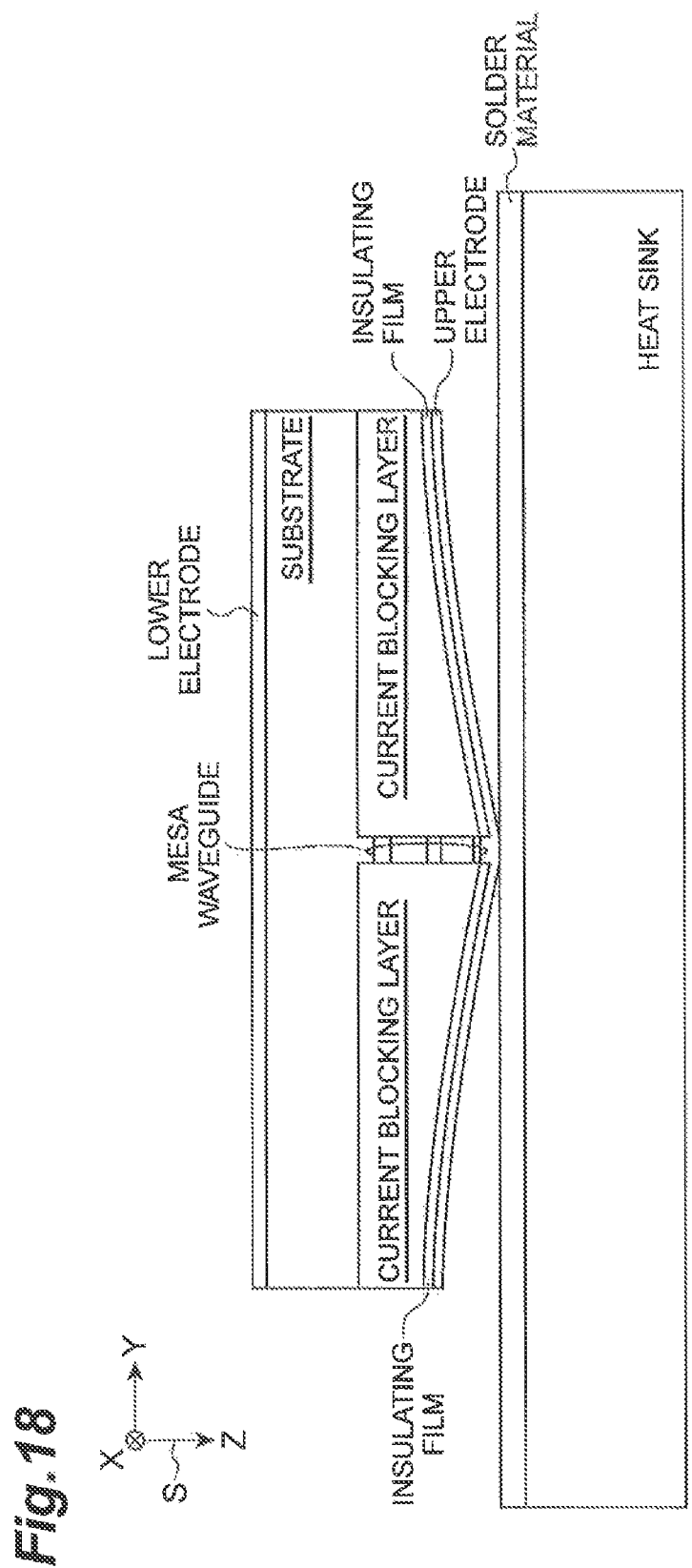
FIG. 18 is a diagram showing a quantum cascade semiconductor laser, mounted on a heat sink, without an alternating array of bulk semiconductor regions and laminate regions in both a distributed Bragg reflection region and a laser region.
Figure 19:
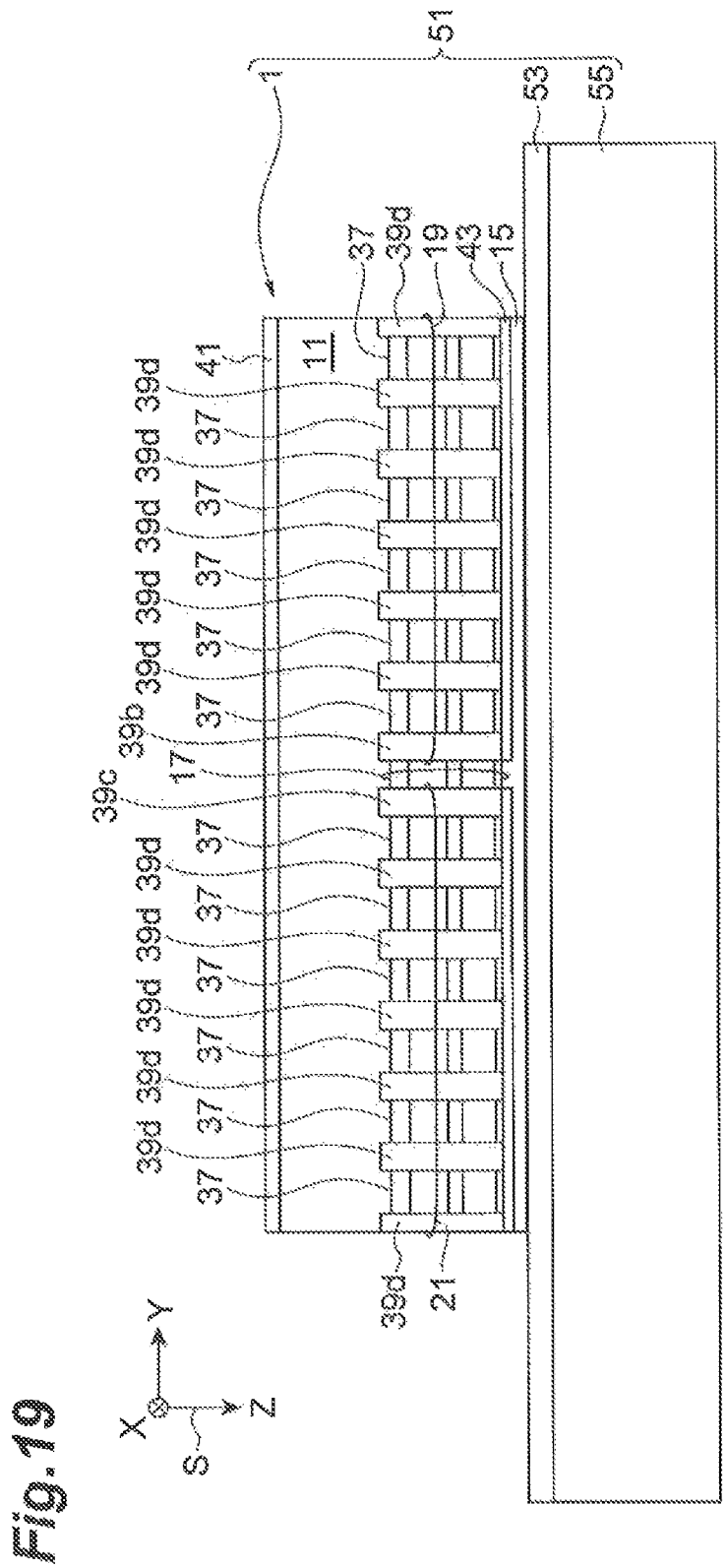
FIG. 19 is a diagram showing a quantum cascade semiconductor laser, mounted on a heat sink, according to the second example.

Since a quantum cascade semiconductor laser consumes a large amount of electric power, the quantum cascade semiconductor laser can be desirably mounted in an epi-down manner allowing superior heat dissipation. Epi-down mounting allows the direct dissipation of heat, which is generated in the core layer during operation of the quantum cascade semiconductor laser, to a heat sink without passing through a thick substrate (up to 100 μm) of the quantum cascade semiconductor laser. Therefore, favorable heat dissipation in the device is realized in the epi-down manner mounting. FIG. 18 is a diagram showing a mounting form in which a conventional BH structure quantum cascade semiconductor laser with no alternating array of bulk semiconductor regions and laminate regions in both the distributed Bragg reflection region and the laser is die-bonded in an epi-down manner. FIG. 19 is a diagram showing a mounting form in which the quantum cascade semiconductor laser having a body region according to the second example is die-bonded in an epi-down manner. As shown in FIG. 18, a conventional BH structure device has a poor flatness of the laser region surface, so that a heat sink supports the upper electrode located only on the top of a mesa waveguide via a soldering material. In the die bond mounting, all the die-bonding force in an epi-down manner concentrates on the mesa waveguide. Accordingly, the first problem is that the mesa waveguide is subjected to mechanical damage, so that device deterioration, such as lasing failure is likely to occur. In addition, the second problem is that even if no damage occurs during the mounting, a heat dissipating path from the core layer to the heat sink is not wide because only the upper electrode on the top of the mesa waveguide of the device is in contact with the heat sink via a soldering material. This structure, despite performing epi-down mounting, cannot efficiently release heat from the core layer to the heat sink, making it difficult to avoid deterioration of thermal characteristics.

As shown in FIG. 19, the structure according to the present example includes the laser region 12 that has an alternating array of the second laminate regions 37 and the second bulk semiconductor regions 39 not only in the distributed Bragg reflection regions 13 and 14 but also similarly the burying regions (19 and 21). The burying regions (19 and 21) have favorable surface flatness, so that semiconductor region over the entire device has favorable surface flatness. In this case, the second laminate regions (37) in the burying regions (19 and 21) each act as a strut with the same height as the mesa waveguide 17, and the arrangement of the struts can share the load in the die-bonding process. This arrangement allows the struts and the mesa waveguide 17 to share the load applied during die-bond mounting in an epi-down manner. The mechanical damage to the mesa waveguide 17 is likely to be reduced to avoid deterioration of the device. Accordingly, the first problem related to the epi-down mounting can be solved.

In addition, in an assembly 51 mounting the quantum cascade semiconductor laser 1 in an epi-down manner as shown in FIG. 19, improvement in surface flatness as described above allows the entire upper electrode 15 on both the burying regions (19 and 21) and the mesa waveguide (17) to be bonded to a heat sink 55 via a solder material 53 during die bond mounting with an epi-down manner. This implementation also allows the efficient release of heat from the core layer 27a to the heat sink 55, and demonstrates favorable heat dissipation intrinsic to epi-down mountings, thereby avoiding deterioration in thermal characteristics. Accordingly, the second problem related to the epi-down mounting can be solved.

As an example, a width (W1 shown in FIG. 2) of the first bulk semiconductor region 33 in the distributed Bragg reflection regions 13 and 14 is favorably 10 micrometers or more in order to avoid growth failure, such as abnormal growth, and is favorably 70 micrometers or less in order to obtain a desired flatness of the surface of the first bulk semiconductor regions 33. In this case, such a failure does not occur in the growth of the first bulk semiconductor regions 33, and the first bulk semiconductor regions 33 thus regrown has slight indentations on the surface thereof, so that the burying regions in the distributed Bragg reflection regions 13 and 14 are provided with favorable flatness. As seen from the above, uniform exposure under an optimal condition can be obtained independent of location in patterning a resist by photolithography which is necessary for processing to form the high refractive index portions 29 of the distributed Bragg reflection regions 13 and 14, and this uniform exposure can allows for processing with high accuracy, so that production yield can be improved, as compared to conventional structures.

As an example, a width (W2 shown in FIG. 2) of the first laminate region 35 of the distributed Bragg reflection regions 13 and 14 is favorably 1 micrometer or more, which allows accurate processing with ordinary manufacturing techniques, such as photolithography and etching, and is favorably 50 micrometers or less in order to prevent polycrystals of the bulk semiconductor from being deposited on the dielectric mask covering the first laminate region 35s during burying regrowth of the first bulk semiconductor region 33, leading to a difficulty in mask removal.

As an example, a width (W3 shown in FIG. 6) of the second bulk semiconductor region 39 in the first burying region 19 and the second burying region 21 is favorably 10 micrometers or more in order to avoid growth failure, such as abnormal growth, and is favorably 70 micrometers or less in order to obtain a desired flatness of a surface of the second bulk semiconductor region 39. In this case, such a failure does not occur in the growth of the second bulk semiconductor, and the second bulk semiconductor region 39 thus regrown has slight indentations on the surface thereof, so that in the die-bonding in epi-down manner, the solder material 53 can fill the slight indentations on the surface of the second bulk semiconductor region 39 without any voids. In the die bonding in epi down manner, the solder material 53 that does not contain any voids can bond the entire upper electrode 15 to the heat sink 55 to provide the device with a favorable heat dissipation.

In an example, a width (W4 shown in FIG. 6) of the second laminate region 37 in each of the first burying region 19 and the second burying region 21 is favorably 1 micrometer or more in order to carry out the processing with general fabricating techniques, such as photolithography and etching, and is favorably 50 micrometers or less in order to prevent difficulty in removing the dielectric mask from occurring because of abnormal deposition, such as polycrystals of the bulk semiconductor, formed during the regrowth of the second bulk semiconductor region 39 on the dielectric mask covering the second laminate region 37.

Another advantage of the device structure according to the present example is that, the process to form the mesa waveguide 17 limits the area to be etched to narrow regions in which the first bulk semiconductor region 33 and the second bulk semiconductor region 39 are to be grown. The present process does not need to carry out wide-ranging etching, which the fabrication of a conventional BH structure quantum cascade semiconductor laser requires, to etch all the semiconductor laminate other than the mesa waveguide, and allows etching gas to be supplied in a concentrated manner to the limited etching regions, so that the etching rate increases to a desired level. The enhancement in etching rate due to the present device structure enables deep mesa etching, such as the formation of a deep mesa of around 5 to 10 micrometers, which is required for a quantum cascade semiconductor laser.

In the present embodiment, the insulating layer 43 for electrical insulation, such as an insulating film constituted by a dielectric material, is provided between the second laminate region 37 and the upper electrode 15, but the insulating film 43 on the second bulk semiconductor region 39 of high resistivity is not essential.

Third Example

In the embodiment as described above, the first bulk semiconductor regions 33 in each of the semiconductor walls 29 acting as high refractive index portions in the distributed Bragg reflection regions 13 and 14 are separated from each other. The present embodiment is not limited to this example. For example, as shown in FIGS. 2 and 9, the first semiconductor capping layer 47 made of the same semiconductor as the semiconductor constituting the first bulk semiconductor region 33 may be provided on the semiconductor walls 29 so as to connect the first bulk semiconductor regions 33 to each other. This structure also has improvement similar to the first and second examples.

Next, novel improvements made by the present examples will be described below. A thickness of the semiconductor walls 29 acting as high refractive index portions in the distributed Bragg reflection regions 13 and 14, i.e., a width (WH in FIG. 1) measured in the direction of the waveguide axis WG, is in the order of several micrometers and is extremely small. The semiconductor walls 29 have low mechanical strength, so that the high refractive index portions are susceptible to damage, such as vibration and/or impact. In contrast, the structure according to the present example enables the first bulk semiconductor regions 33 to be connected to each other by the first semiconductor capping layer 47 that is made of the same material as the first bulk semiconductor regions 33, so that the first bulk semiconductor regions 33 and the first semiconductor capping layer 47 form an integrated structure. Since the first bulk semiconductor regions 33 and the first semiconductor capping layer 47 are made of the same material, as a result of the connection, the first bulk semiconductor regions 33 and the first semiconductor capping layer 47 are crystallographically integrated with each other to constitute a structure made of a single material. The connection can increase strength of the semiconductor walls 29. Accordingly, the present example allows the distributed Bragg reflection regions 13 and 14 to become less susceptible to damage, as compared to the structures according to the first and second examples in which the first bulk semiconductor regions 33 are separated from each other, thereby further improving production yield and durability of the device.

Fourth Example

In the first and second examples, as shown in FIGS. 3 and 6, in order to provide electrical insulation in the burying regions (19 and 21) which bury the mesa waveguide 17 of the laser region 12, a dielectric insulating film acting as the insulating layer 43 is provided between the upper electrode 15 and the burying regions (19 and 21). The present embodiment is not limited to these examples. A second semiconductor capping layer, which acts as the insulating layer 43, made of a high resistive semiconductor may be provided on the laser region 12 in place of the dielectric insulating film. A high resistive semiconductor layer applicable to the second semiconductor capping layer is, for example, a transition metal-doped semi-insulating semiconductor or an undoped semiconductor which can be used for the first and second bulk semiconductor regions 33 and 39. The structure according to the present example allows for a similar improvement to the first and second examples can be obtained.

Another advantage gained by the structure according to the present example is to improve heat dissipation because the second semiconductor capping layer 43 electrically insulates the upper electrode 15 and the burying regions 19 and 21 from each other and is formed of a semiconductor with significantly higher thermal conductivity than a dielectric insulating film. In addition, in the second example, the second semiconductor capping layer 43 can be grown on a surface of the bulk semiconductor region 39 to fill any depressions, which may be created because of the second laminate regions 37 arrayed in the first burying region 19 and in the second burying region 21 in re-growing bulk semiconductor regions 39 between the second laminate regions 37, thereby making a surface of the second semiconductor capping layer 43 planarized. Therefore, the second semiconductor capping layer used as the insulating layer 43 can further improve flatness of the device surface, as compared to a device containing a dielectric insulating film as the insulating layer 43. As described above, with the structure according to the present example, the superior thermal conductivity of the second semiconductor capping layer 43 and a further improvement in the flatness of the device surface of the capping layer can enhance heat dissipation from a chip of the quantum cascade semiconductor laser 1 to a heat sink in an epi-down mounting manner, as compared to the structure according to the second example in which a dielectric insulating film is used. Accordingly, the second problem related to the epi-down mounting can be solved more readily.

Fifth Example

In the description of the second example, an alternating array of the first bulk semiconductor region 33 and the first laminate region 35 is applied to the entire distributed Bragg reflection regions 13 and 14, and an alternating array of the stripe-shaped second bulk semiconductor regions 39 and the stripe-shaped second laminate regions 37 is applied to the entire burying regions 19 and 21 of the laser region 12. The present embodiment is not limited to this example. As shown in FIG. 7, the alternating array of the first bulk semiconductor regions 33 and the first laminate regions 35 may be applied to only the first portions 29a of the distributed Bragg reflection regions 13 and 14, and the alternating array of the stripe-shaped second bulk semiconductor region 39 and the stripe-shaped second laminate region 37 may be applied to only the first burying portions 20a of the first burying region 19 and the second burying region 21 of the laser region 12. The application of the alternating array to the first burying portions 20a located in the vicinity of the mesa waveguide 17 allows the vicinity of the mesa waveguide 17, which generates heat during operation, to have a favorable flatness, thereby forming favorable heat dissipation pass. This embodiment also has an improvement similar to the second example. Meanwhile, the remaining second burying portion 20b in the first burying region 19 and the second burying region 21 can be buried by the only second bulk semiconductor region 39 (39e). Any bulk semiconductors can be used for the second bulk semiconductor region 39, and can be, for example, semi-insulating semiconductor or undoped semiconductor, which exhibits small optical absorption of mid-infrared light. In addition, in the semiconductor walls 29 of the distributed Bragg reflection regions 13 and 14, the alternating array of the first bulk semiconductor regions 33 and the first laminate regions 35 can be applied to the first portions 29a located near the waveguide axis, and the first bulk semiconductor regions 33 can be applied to the second portions 29b located outside the alternating array. Any bulk semiconductors can be used for the bulk semiconductor region, and can be, for example, the above semi-insulating semiconductor or undoped semiconductor, which exhibits small optical absorption of mid-infrared light.

The application of the alternating array of the second bulk semiconductor region 39 and the second laminate region 37 to the laser region 12 in the present example improves flatness of both the surface of the mesa waveguide 17, which includes the core layer 27a that generates heat in response to injected current, and the adjoining surface around the mesa waveguide 17. These flat surfaces make epi-down mounting easy, leading to a similar improvement in the second example. In addition, the first portions 29a with the alternating array in the distributed Bragg reflection regions 13 and 14 each act as a principal part to reflect propagating light. In this case, an improved surface flatness is given to the first portions 29a, each of which is located in the vicinity of the waveguide axis WG and acts as the high refractive index portion having a dominant reflection in the distributed Bragg reflection regions 13 and 14, and this allows the formation of the high refractive index portion with an improved dimension accuracy in a similar manner to the first example.

Meanwhile, a novel improvement made by the present example is that in the structure according to the present example, a bulk semiconductor alone buries the areas 20b and 29b outside of a region in the vicinity of the waveguide axis WG in the laser region 12 and the distributed Bragg reflection regions 13 and 14. The second burying portion 20b thus formed in the laser region 12 can be made of a high resistance bulk semiconductor, so that the resistivity of the burying regions 19 and 21 is made higher as compared to the structure according to the second example, thereby further reducing a leakage current flowing through the burying regions 19 and 21 outside of the mesa waveguide 17. Accordingly, characteristics of the quantum cascade semiconductor laser can be further improved. In addition, the distributed Bragg reflection regions 13 and 14 each have a structure in which the core layer 27a in the first laminate region 35 of the high refractive index portion 29 includes a superlattice with several hundred layers of quantum well layers and barrier layers being laminated as described above and is thick in the direction of the normal axis NX with a thickness of several micrometers. Each of the semiconductor layers constituting the superlattice of the core layer 27a which has a small lattice strain distortion with respect to the substrate, but the accumulated strain of the superlattice would become large after a large number of the semiconductor layers are stacked to form the superlattice. Such a large stress due to the accumulated strain may lower the mechanical strength of the high refractive index portions 29, and processing damage incurred in forming the high refractive index portion 29 by etching may result in crystalline deterioration, such as crack and film exfoliation, in the high refractive index portion 29, thereby making the distributed Bragg reflection regions susceptible to damage. In particular, the high refractive index portion 29, which has a width WH of several micrometers in the direction of the waveguide axis WG, is thin in thickness, and accordingly has a low mechanical strength, and such damages are likely to occur. In contrast, the semiconductor wall 29 in the present example has one or more parts (29b) made of a bulk semiconductor region of high mechanical intensity, and can provide the high refractive index portion 29 of the distributed Bragg reflection regions 13 and 14 with the high mechanical strength. The structure according to the present example makes the mechanical strength of the high refractive index portion high, and makes the high refractive index portion less susceptible to damage.

In the present example, a bulk semiconductor region is applied to sectioned regions apart from the waveguide axis WG in both the distributed Bragg reflection regions 13 and 14 and the first and second burying regions 19 and 21 of the laser region 12. The above structure that contains the bulk semiconductor region partly may be applied to one of the laser region 12 and the distributed Bragg reflection regions 13 and 14.

Sixth Example

In the examples described above, each of the semiconductor walls 29 acting as high refractive index portions in the distributed Bragg reflection regions 13 and 14 is provided independent of each other. The present embodiment is, however, not limited to these examples. The semiconductor walls 29 may be connected to each other. FIG. 10 shows, for example, a structure formed by applying the structure according to the present example to the structure of the fifth example. As shown in FIG. 10, the first reinforcing section 30*d* made of a bulk semiconductor region may connect the second portion 29*b* in each of high refractive index portions 30*a*, 30*b*, and 30*c* with each other to integrate the first reinforcing section 30*d* and the high refractive index portions 30*a*, 30*b*, and 30*c*. For example, in the connection between the first wall 30*a* and the second wall 30*b*, an 11-th portion 30*e* in the second portion 29*b* of the first wall 30*a* and a 21-th portion 30*f* in the second portion 29*b* of the second wall 30*b* are connected to each other by the first reinforcing section 30*d*.

The device structure of a quantum cascade semiconductor laser according to the present example is also provided with the various improvements described in the fifth example. Furthermore, in the present example, the addition of the first reinforcing section 30*d* allows the high refractive-index portions 30*a*, 30*b*, and 30*c* having small widths of several micrometers, defined in the direction of the waveguide axis WG, to be integrated with each other to increase the mechanical strength of the distributed Bragg reflection regions. This structure makes the distributed Bragg reflection regions 13 and 14 less susceptible to damage, as compared to the structures according to the other examples described above in which the high refractive index portions are separated from each other, and results in that production yield and durability of the device can be further improved.

A semiconductor can be used as a material of the first reinforcing section. A semiconductor material applicable to the high refractive index portions, specifically semiconductor, such as InP, GaInAs, AlInAs, GaInAsP, and AlGaInAs, as described above can be used for semiconductor of the first reinforcing section. In particular, it is preferable that the first reinforcing section 30*d* and connecting sections of the second portions 29*b* (of the first bulk semiconductor region 33) of the high refractive index portions 30*a*, 30*b*, and 30*c* to be connected to the first reinforcing section 30*d* be made of the same semiconductor material, such as Fe-doped InP, and in this structure, both the first reinforcing section 30*d* and the connecting sections of the second portions 29*b* of the high refractive index portions 30*a*, 30*b*, and 30*c* are crystallographically integrated with each other to constitute a structure made of a single material. The integration can increase the strength of the distributed Bragg reflection regions 13 and 14 effectively. In addition, both the first reinforcing section 30*d* and the connecting sections of the second portions 29*b* of the high refractive index portions 30*a*, 30*b*, and 30*c* can be formed with the same material. This way of the formation can simplify the production process. The material of the first reinforcing section 30*d* is, however, not limited to those described above and, if necessary, in order to improve the mechanical strength of the distributed Bragg reflection regions 13 and 14, other materials enabling the improvement can be used.

The present example demonstrates a distributed Bragg reflection structure in which all of the high refractive index portions 30*a*, 30*b*, and 30*c* are coupled and integrated by the first reinforcing section 30*d*. The present embodiment is not limited to this example. At least two high refractive index portions among the high refractive index portions are connected by the first reinforcing section to form a structure integrating them. This structure can provide the distributed Bragg reflection regions with the larger mechanical strength thereof.

In the present example, the first reinforcing section 30*d* is added to the structure according to the fifth example. The present embodiment is not limited to this example. The first reinforcing section 30*d* according to the sixth example can also be applied to the first to fourth examples, and the respective structures formed by applying the first reinforcing section 30*d* to the first to fourth examples have the advantage of the same improvement as described above.

Seventh Example

In the sixth example, a reinforcing structure for the distributed Bragg reflection regions is not limited to a structure in which high refractive index portions are integrally connected with each other by the first reinforcing section. In the structure shown in FIG. 6, as shown in FIG. 11, the 11-th portion 30*e* in the second portion 29*b* of the high refractive index portion 30*a* that is closest to an end surface of the laser region 12 is connected to the burying section 39*a* in the second burying portion 20*b* of the laser region 12 by the second reinforcing section 30*g* to form the structure thus integrated. The structure shown in FIG. 11 includes an integration structure provided by the first reinforcing section 30*d* described in the sixth example in addition to reinforcement provided by the second reinforcing section 30*g*.

The structure according to the present example is the same as the structure according to the sixth example with the exception of the introduction of the second reinforcing section 30*g*, and the various improvements described in the sixth example may be obtained. In addition, in the structure according to the present example, the high refractive index portion 30*a* and the laser region 12 are integrated by the second reinforcing section 30*g*, so that the integration can provide the distributed Bragg reflection regions 13 and 14 with an increased mechanical strength, and allows the distributed Bragg reflection regions 13 and 14 to become less susceptible to damage as compared to the structures of the other examples described above having the separated high refractive index portions, leading to improvement in production yield and durability of the device.

In a structure in which the distributed Bragg reflection regions 13 and 14 include the high refractive index portions 29 as is the case of the structure according to the present example, the high refractive index portions 29 may be mutually coupled by the first reinforcing section 30*d* to form an integrated structure as in the structure according to the sixth example. This structure can further increase the mechanical strength of the distributed Bragg reflection regions 13 and 14, and can further improve production yield and durability of the device, as compared to a structure including the second reinforcing section 30*g* alone. Moreover, one or more of the high refractive index portions 29 in the distributed Bragg reflection regions 13 and 14 may be coupled through a corresponding first reinforcing section 30*d*.

A material of the second reinforcing section 30*g* can be the same as a material usable in, for example, the first reinforcing section 30*d* described in the sixth example. In particular, when the second reinforcing section 30*g* and the connecting section (30*e*) of the second portion 29*b* (the first bulk semiconductor region 33) of the high refractive index portion 30*a* are made of the same bulk semiconductor, such as Fe-doped InP, the second reinforcing section 30*g* and the connecting section (30*e*) of the second portion 29*b* of the high refractive index portion 30*a* are crystallographically integrated with each other, thereby constituting a structure made of a single material with increasing the strength of the distributed Bragg reflection regions 13 and 14. In addition, this structure allows both the second reinforcing section 30*g* and the connecting section (30e) of the second portion 29b of the high refractive index portion 30a to be formed together with the same material, and accordingly can simplify the manufacturing process. Furthermore, when the second reinforcing section 30g, the connecting section (30e) of the second portion 29b of the high refractive index portion 30a, and the connecting section (39a) of the second burying portion 20b of the laser region 12 are made of the same bulk semiconductor, such as Fe-doped InP, the three sections are crystallographically integrated with each other to constitute a structure made of a single material, thereby further increasing the strength of the distributed Bragg reflection regions effectively. In addition, this structure allows the three sections to be formed together with the same material, and can further simplify the manufacturing process. In particular, it is preferable that the mechanical strength of the distributed Bragg reflection regions 13 and 14 be maximized by a structure in which all of the connecting section of the second portion 29b of high refractive index portions, the first reinforcing section 30d, the second reinforcing section 30g, and the connecting section of the second burying portion 20b of the laser region 12 are made of the same bulk semiconductor, and all of the second portion 29b of high refractive index portions and the second burying portion 20b of the laser region 12 are connected by the first reinforcing sections 30d and the second reinforcing sections 30g.

The description given above reveals that the reinforcement structure according to the present example is applied to the structure according to the sixth example. The present embodiment is, however, not limited thereto. For example, the structure according to the seventh example can also be applied to the first to fifth examples, and these structures thus applied have the same beneficial effects as described above.

Eighth Example

In the example described above, the high refractive index portions 29 of the distributed Bragg reflection regions 13 and 14 extend to the device ends 3a and 3b in a direction along the substrate main surface 11a or, in other words, the lateral direction (Y direction). The present embodiment is not limited to this example. The high refractive index portions need not necessarily extend to the device ends in the horizontal lateral direction (Y direction). For example, FIG. 12 shows a structure in which the distributed Bragg reflection structure according to the present example is applied to the structure according to the second example. The structure according to the present example is the same as the structure according to the second example with the exception of the distributed Bragg reflection regions 13 and 14. The present example has the various beneficial effects described in the second example.

Figure 20:
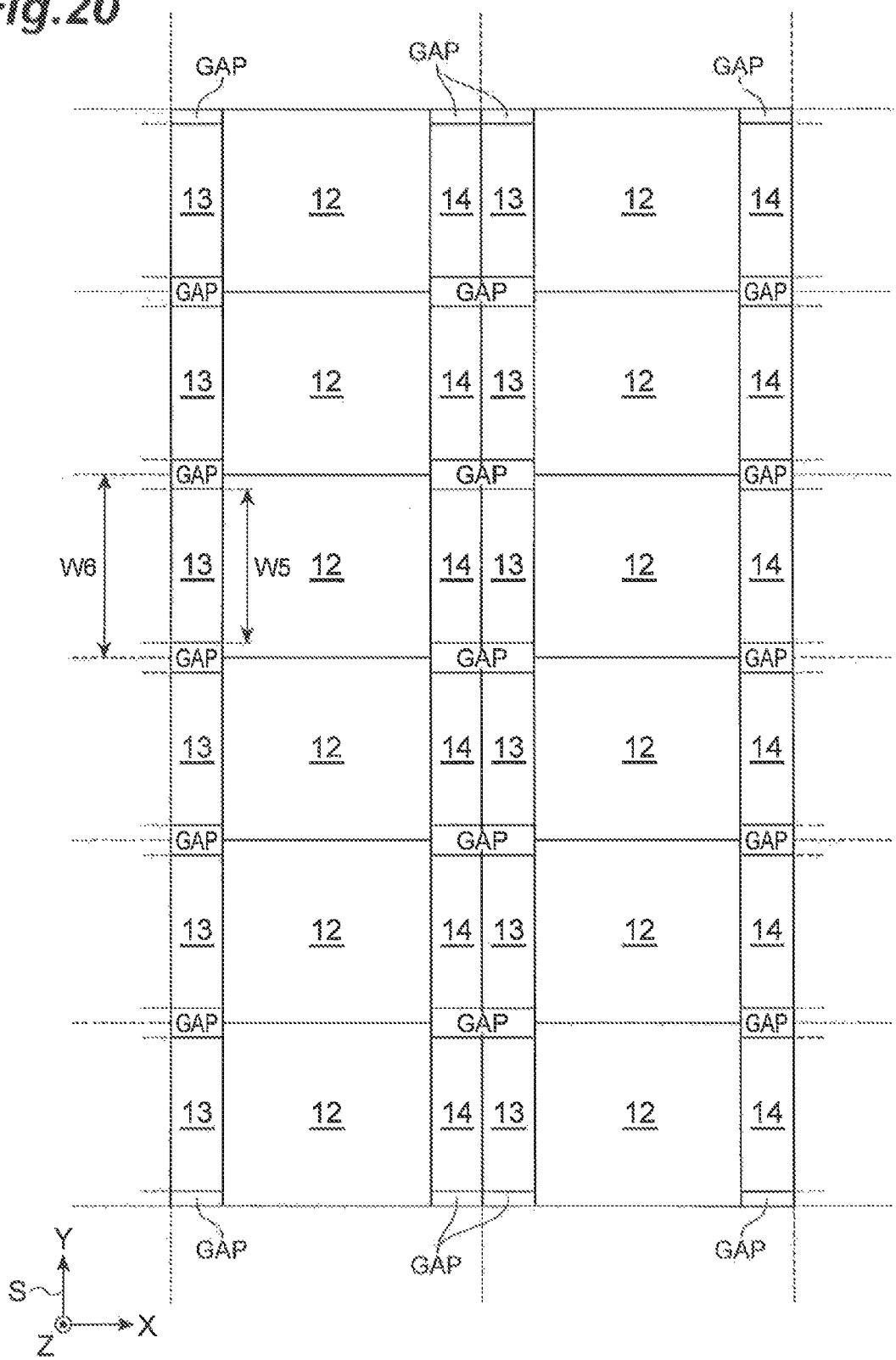
FIG. 20 is a plan view showing an array of devices sections in a process in fabricating the quantum cascade semiconductor laser shown in FIG. 12.

In addition, in the present example, a wall width (W5 in FIG. 12) of the high refractive index portions of the distributed Bragg reflection regions is shorter than a device width (W6 in FIG. 12) in the lateral direction. This structure gains the following novel advantages. Specifically, in the actual fabrication of a quantum cascade semiconductor laser, device sections for the quantum cascade semiconductor laser 1 are arrayed two-dimensionally on the surface of a substrate, so that a large number of devices are formed together. FIG. 20 shows an array of device sections on the surface of the substrate in fabricating the quantum cascade semiconductor laser 1 shown in FIG. 12. Twelve device sections are shown in FIG. 20. In the quantum cascade semiconductor laser 1 shown in FIG. 12, the width W5 of the high refractive index portions 29 of the distributed Bragg reflection regions 13 and 14 is shorter than a width W6 of the device sections. Referring to this structure shown in FIG. 20, the high refractive index portions 29 of the distributed Bragg reflection regions 13 and 14 are apart from side boundaries 3a and 3b of the device sections, and provides the distributed Bragg reflection regions 13 and 14 with a separation region GAP (void communicating section 16) which does not include the high refractive index portion 29 and which extends along the side boundaries 3a and 3b. This array structure of device sections allows etching gas to flow more readily via the separation region GAP in the direction of the first axis Ax1 (X direction) in dry etching to form the high refractive index portions 29 and to circulate more easily during the etching, as compared to an array structure of device sections that does not include any separation region GAP. This array can reduce a fluctuation in etching rates arising from a microloading effect on the substrate surface, thereby improving uniformity and reproducibility of etching in formation of the high refractive index portion on the substrate surface.

In addition, as described above, in this array of device sections, the separation regions GAP in which the high refractive index portion 29 is not formed are provided around boundaries of the device sections. Cleaving the GAP region in the direction of the first axis Ax1 (X direction) to form devices in the process to separate the substrate can prevent the high refractive index portion 29 from being damaged, thereby avoiding a decline in production yield by the damage of the high refractive index portion 29 during the device separation process, as compared to the array structure of device sections that does not include any separation region GAP. Furthermore, the reduction of the width W5 makes a ratio (W5/H), defined by a height H of the high refractive index portions 29 (a size of the high refractive index portion in the Z axis direction) and the width W5 of the high refractive index portions, reduced, and accordingly another advantage may be gained in that the mechanical strength of the high refractive index portions 29 is increased and that the high refractive index portions 29 become less susceptible to damage, as compared to an array structure of device sections that does not include the separation region GAP. Moreover, as seen from the above description, the structure according to the present example in which the structure according to the present example is applied to the second example, and the structure according to the present example can be applied to other examples, and these applications obtain the same improvements described above.

The examples described above present structures in which the low refractive index portions 22, 24, and 26 of the distributed Bragg reflection regions 13 and 14 are voids, such as gaps which are filled with air. A refractive index of air is lowest among potential materials and is around 1, so that a structure in which the low refractive index portions 22, 24, and 26 are voids has a large refractive index difference between the high refractive index portions and the low refractive index portions. In distributed Bragg reflection structures, the reflectivity increases with the refractive index difference, so that the reflectivity of one end in the optical cavity including distributed Bragg reflection structures can be readily increased when each of the low refractive index portions is constituted by a void, such as air layer. The low refractive index portions 22, 24, and 26 are, however, not limited thereto and can be made of any material with a lower refractive index than the semiconductor walls 29 constituting the high refractive index portions. Examples of such materials include dielectric materials, such as $SiO_2$, SiON, SiN, alumina, BCB resin, and polyimide resin. The low refractive index portions 22, 24, and 26 including one of these dielectric materials allow a dielectric layer of the low refractive index portions 22, 24, and 26 to lie on each of the side surfaces of the semiconductor wall 29 of the thin high refractive index portion having a width of around several micrometers so as to support the semiconductor wall 29. The support by the dielectric layers forming the low refractive index portions 22, 24, and 26 provides an advantage of improving the mechanical strength of the semiconductor walls 29 for the high refractive index portions. In order to increase the reflectivity of one end of the laser region, integrated with distributed Bragg reflection regions, in an efficient manner, the widths WL and WH of the low refractive index portion and the high refractive index portion, defined in the direction of the waveguide axis WG, are desirably set as follows.

Width (WH) of semiconductor wall (29): odd multiple of $\lambda/(4 \times n1)$, where "n1" denotes a refractive index of the semiconductor wall and "$\lambda$" denotes a lasing wavelength in vacuum.

Width (WL) of low refractive index portions (22 and 24): odd multiple of $\lambda/(4 \times n2)$, where "n2" denotes a refractive index of the low refractive index portions.

The quantum cascade semiconductor laser according to the example described above has a structure in which the distributed Bragg reflection regions 13 and 14 are integrated with both ends of the laser region 12. The present embodiment is not limited to this example. The distributed Bragg reflection regions may be provided on one of the ends of the laser region. In the example described above, the distributed Bragg reflection regions have three high refractive index portions 29. The present embodiment is not limited to this example, and the distributed Bragg reflection regions may include any number of high refractive index portions as necessary. The reflectivity becomes higher with increasing the number of high refractive index portions.

The distributed Bragg reflection regions 13 and 14 according to the example described above includes more than one high refractive index portions 29. In such a distributed Bragg reflection region, if necessary, a part of the high refractive index portions may be made of a different semiconductor material from the other part, and similarly, in a structure in which a distributed Bragg reflection region includes more than one low refractive index portions, if necessary, at least a part of the low refractive index portions may be made of a different material from the other part. The quantum cascade semiconductor laser including these high refractive index portions and/or low refractive index portions can gain the same improvements as the present example.

DFB quantum cascade semiconductor lasers have been described in the examples presented above. The quantum cascade semiconductor laser according to the embodiment is not limited to a DFB quantum cascade semiconductor laser. All the examples described above can be applied in a similar manner to a Fabry-Perot (FP) quantum cascade semiconductor laser, which does not include any diffraction grating layer and can gain improvements similar to those of a DFB quantum cascade semiconductor laser.

While the respective examples above have been described with reference to quantum cascade semiconductor lasers, the present embodiment is not limited to quantum cascade semiconductor lasers and is also applicable to a semiconductor element with a similar structure to the device structure according to the examples described above, such as a semiconductor laser with a p-n junction which is used for optical communications, which has similar advantages to those of quantum cascade semiconductor lasers.

Technical significance of the present embodiments will now be described.

In the formation of conventional BH structure quantum cascade semiconductor lasers which integrate distributed Bragg reflection regions and in which the laminate regions (35 and 37) according to the present embodiment are not provided in distributed Bragg reflection regions and burying regions, a semiconductor laminate including layers from a lower cladding layer to a diffraction grating layer, is grown on an entire semiconductor surface, and a diffraction grating structure is formed in the diffraction grating layer. Subsequently, an upper cladding layer and a contact layer are grown on the diffraction grating layer to form a semiconductor laminate region. Next, a mask of a dielectric film that defines a stripe mesa waveguide extending along a waveguide axis is formed on the semiconductor laminate region, and the semiconductor laminate region is etched with the mask so as to leave the stripe-shaped mesa waveguide alone that is protected by the mask and form void portions by selectively removing the entire portions of the semiconductor laminate region that have been located on both side surfaces of the mesa waveguide before the etching. Subsequently, with the mask being left, a burying region (current blocking layer) made of a semi-insulating semiconductor or an undoped semiconductor is formed by selective regrowth in an apparatus for growing semiconductor crystal, so that semiconductor of the burying region grows to fill the void portions. During the growth, in a vicinity of the mesa waveguide, a growth rate of a current blocking layer is high because of contributions from both a growth on the primary surface of the substrate and a growth on the side surface of the mesa waveguide along the waveguide axis. In contrast, in an area apart from the mesa waveguide in a lateral direction (Y direction) along the main surface of the substrate, contribution from the growth on the side surfaces of the mesa becomes little and only contribution from growth on the main surface of the substrate is dominant, so that the growth rate of the current blocking layer is not high. The current blocking layer thus grown has a thickness profile which gradually decreases with distance from the mesa waveguide in a lateral direction (Y direction). Consequently, this BH quantum cascade semiconductor laser has a poor flatness of the device surface (for example, a BH quantum cascade semiconductor laser shown in FIG. 17). For example, a level difference (DH in FIG. 17) between a vicinity of the mesa waveguide and a vicinity of a device edge apart from the mesa waveguide is large, e.g., 5 to 6 micrometers. Next, after removing the mask for buried regrowth, a new dielectric film is formed over the entire wafer. Then, a dielectric mask is formed from the new dielectric film, and the dielectric mask has a pattern covering the entire laser region, and a pattern covering a region in which high refractive index portions for a distributed Bragg reflection region are to be formed. In the distributed Bragg reflection region, a width of the pattern which defines a high refractive index portion and a width of the spacing between adjacent patterns each of which defines a high refractive index portion, where these widths are defined in the direction of the waveguide axis, are set so that the width of the high refractive index portions and the width of the low refractive index portions assume respective optimal values (for example, odd multiple of $\lambda/(4 \times n1)$ and odd multiple of $\lambda/(4 \times n2)$) enabling high reflectivity in the distributed Bragg reflection region. An underlying semiconductor region is etched with the dielectric mask, and the parts of the semiconductor region which are not covered with the dielectric mask and in which low refractive index portions are to be formed are selectively removed to expose the substrate thereat. After the etching, the dielectric mask is removed. The etching process can form high refractive index portions and low refractive index portions in the distributed Bragg reflection region. Next, an opening is formed in an insulating film and the opening is positioned on the contact layer in the mesa waveguide region of the laser region, and thereafter, an upper electrode and a lower electrode are formed thereon.

The top surface of the burying region for the quantum cascade semiconductor laser of the above-described structure has a poor surface flatness, so that in performing resist patterning by photolithography or EB lithography for forming a dielectric mask that defines high refractive index portions of the distributed Bragg reflection region, a level difference (DH) between an area in the vicinity of the mesa waveguide and an area in the vicinity of the device boundary causes a difference in optimal resist exposure conditions for patterning resist therebetween to become significant. In forming a pattern for high refractive index portions, the significant difference of the optimal resist exposure conditions makes it difficult to apply an optimal resist exposure to an entire resist in the lateral direction (Y direction), thereby degrading patterning accuracy of the resist. The poor accuracy in patterning resist causes a poor patterning accuracy of a dielectric mask formed by etching with the patterned resist as a mask. This leads to a poor processing accuracy of the high refractive index portions in the distributed Bragg reflection region which are formed by etching with the dielectric mask, resulting in a low accuracy of a width of the low refractive index portion in the direction of the waveguide axis. Such deterioration in the processing accuracy of the distributed Bragg reflection region, eventually, leads to deterioration in intra-plane uniformity and reproducibility of reflectivity of the distributed Bragg reflection region, thereby making production yield bad.

In contrast, the distributed Bragg reflection region according to the present embodiment enables the improvement in the surface flatness of a BH structure device, and the in-plane uniformity and reproducibility of reflectivity in a distributed Bragg reflection region that is wider than a mesa waveguide, resulting in that the quantum cascade semiconductor laser can be fabricated with a high yield.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A quantum cascade semiconductor laser comprising:
   a substrate with a main surface including a waveguide area and a distributed Bragg reflection area that are arranged in a direction of a first axis;
   a laser region provided on the waveguide area of the substrate, the laser region including a mesa waveguide having a first side surface and a second side surface, a first burying region provided on the first side surface and the main surface of the substrate, and a second burying region provided on the second side surface and the main surface of the substrate, the first and second side surfaces of the mesa waveguide extending in the direction of the first axis;
   a distributed Bragg reflection region provided on the distributed Bragg reflection area of the substrate, the distributed Bragg reflection region including a semiconductor wall extending in a direction of a normal axis perpendicular to the main surface of the substrate, the semiconductor wall including a plurality of first bulk semiconductor regions and a plurality of first laminate regions that are alternately arrayed in a direction of a second axis intersecting the first axis and the normal axis; and
   an upper electrode provided on the laser region, the upper electrode being in contact with a top surface of the mesa waveguide,
   wherein each of the first bulk semiconductor regions includes a bulk semiconductor layer, and
   each of the first laminate regions includes a stacked semiconductor layer having a plurality of semiconductor layers.

2. The quantum cascade semiconductor laser according to claim 1,
   wherein the mesa waveguide includes a core layer and an upper cladding layer disposed on the core layer, and
   the stacked semiconductor layer of the first laminate regions includes the core layer and the upper cladding layer.

3. The quantum cascade semiconductor laser according to claim 1,
   wherein each of the first and second burying regions includes a plurality of second bulk semiconductor regions and a plurality of second laminate regions that are alternately arrayed in the direction of the second axis, and
   each of the second laminate regions includes the stacked semiconductor layer of the first laminate regions.

4. The quantum cascade semiconductor laser according to claim 3,
   wherein each of the first and second burying regions includes a first burying portion and a second burying portion that are arranged along the direction of the second axis in order from a waveguide axis toward a side surface of the quantum cascade semiconductor laser,
   the first burying portion includes the second laminate regions and the second bulk semiconductor regions that are alternately arrayed in the direction of the second axis, and
   the second burying portion does not include the second laminate regions and includes the second bulk semiconductor regions extending in the direction of the second axis.

5. The quantum cascade semiconductor laser according to claim 3,
   wherein the second bulk semiconductor regions include an undoped or semi-insulating semiconductor.

6. The quantum cascade semiconductor laser according to claim 1, further comprising a semiconductor capping layer provided on the first bulk semiconductor regions in the semiconductor wall,
   wherein the semiconductor capping layer is in contact with the first bulk semiconductor regions of the semiconductor wall, and
   the semiconductor capping layer is made of the same material as that of the first bulk semiconductor regions.

7. The quantum cascade semiconductor laser according to claim 1,
   wherein the semiconductor wall includes a first portion and a second portion that are arranged along a direction of the second axis in order from a waveguide axis toward a side surface of the quantum cascade semiconductor laser, the first portion includes the first laminate regions and the first bulk semiconductor regions that are alternately arrayed in the direction of the second axis, and the second portion does not include the first laminate regions and includes the first bulk semiconductor regions.

8. The quantum cascade semiconductor laser according to claim 1, further comprising an insulating film made of a dielectric material, the insulating film being provided between the upper electrode and the first burying region and between the upper electrode and the second burying region.

9. The quantum cascade semiconductor laser according to claim 1, further comprising a semiconductor capping layer made of an undoped semiconductor or a semi-insulating semiconductor, the semiconductor capping layer being provided between the upper electrode and the first burying region and between the upper electrode and the second burying region.

10. The quantum cascade semiconductor laser according to claim 1, further comprising a first reinforcing section connecting a first of the semiconductor walls and a second of the semiconductor walls with each other.

11. The quantum cascade semiconductor laser according to claim 10, wherein the first and the second of the semiconductor walls includes a portion that is connected to the reinforcing section, and the reinforcing section and the portions of the first and the second of the semiconductor walls connected to the reinforcing section are made of the same material.

12. The quantum cascade semiconductor laser according to claim 1, further comprising a reinforcing section connecting each of the first and second burying regions to the semiconductor wall.

13. The quantum cascade semiconductor laser according to claim 12, wherein the semiconductor wall includes a connecting section that is connected to the reinforcing section, and the reinforcing section and the connecting section of the semiconductor wall are made of the same material.

14. The quantum cascade semiconductor laser according to claim 12, wherein the first burying region includes a portion that is connected to the reinforcing section, the second burying region includes a portion that is connected to the reinforcing section, and the reinforcing section and the portions of the first and the second burying regions that are connected to the reinforcing section are made of the same material.

15. The quantum cascade semiconductor laser according to claim 1, wherein the semiconductor wall has a length shorter than a width of the substrate in the direction of the second axis.

* * * * *